(12) United States Patent
Ueyama

(10) Patent No.: US 11,570,390 B2
(45) Date of Patent: Jan. 31, 2023

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Shota Ueyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/289,976

(22) PCT Filed: Oct. 18, 2019

(86) PCT No.: PCT/JP2019/041165
§ 371 (c)(1),
(2) Date: Apr. 29, 2021

(87) PCT Pub. No.: WO2020/095659
PCT Pub. Date: May 14, 2020

(65) Prior Publication Data
US 2021/0306588 A1    Sep. 30, 2021

(30) Foreign Application Priority Data

Nov. 9, 2018 (JP) .............................. JP2018-211386

(51) Int. Cl.
*H04N 5/3745* (2011.01)
*H04N 5/374* (2011.01)
*H04N 5/378* (2011.01)

(52) U.S. Cl.
CPC ......... *H04N 5/37455* (2013.01); *H04N 5/378* (2013.01); *H04N 5/3741* (2013.01)

(58) Field of Classification Search
CPC .. H04N 5/37455; H04N 5/3741; H04N 5/378; H04N 5/3742; H01L 27/14612
See application file for complete search history.

(56) References Cited

U.S. PATENT DOCUMENTS

| 9,179,084 B2 * | 11/2015 | Yamaoka ............. H04N 5/3765 |
| 2006/0169871 A1 * | 8/2006 | Kochi .................... H04N 5/378 |
| | | 348/E3.018 |

(Continued)

FOREIGN PATENT DOCUMENTS

| CN | 106031162 A | 10/2016 |
| EP | 3116217 A1 | 1/2017 |

(Continued)

OTHER PUBLICATIONS

International Search Report and Written Opinion of PCT Application No. PCT/JP2019/041165, dated Jan. 14, 2020, 09 pages of ISRWO.

*Primary Examiner* — Nhan T Tran
(74) *Attorney, Agent, or Firm* — Chip Law Group

(57) ABSTRACT

Provided are a solid-state imaging device capable of improving image quality of a captured image even if the pixel size is increased, and an electronic device equipped with the solid-state imaging device. A solid-state imaging device is provided that includes: at least two column areas that perform Analog To Digital (AD) conversion of a pixel signal generated by a pixel; a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

7 Claims, 21 Drawing Sheets

(56) References Cited

U.S. PATENT DOCUMENTS

| | | | | |
|---|---|---|---|---|
| 2010/0182472 A1* | 7/2010 | Yamagata | ............ | H04N 5/3745 |
| | | | | 348/E5.091 |
| 2014/0333815 A1* | 11/2014 | Iwane | .................... | H04N 3/155 |
| | | | | 348/308 |
| 2015/0349012 A1* | 12/2015 | Kobayashi | ........... | H04N 5/3577 |
| | | | | 250/208.1 |
| 2017/0195603 A1* | 7/2017 | Kawazu | ............... | H04N 5/3742 |

FOREIGN PATENT DOCUMENTS

| | | |
|---|---|---|
| JP | 2018-011141 A | 1/2018 |
| JP | 2018-113613 A | 7/2018 |
| KR | 10-2016-0129844 A | 11/2016 |
| WO | 2015/133323 A1 | 9/2015 |
| WO | 2018/012068 A1 | 1/2018 |
| WO | 2018/131521 A1 | 7/2018 |

* cited by examiner

P-PHASE DISTRIBUTION IMAGE

SOLID-STATE IMAGING DEVICE AND ELECTRONIC DEVICE

CROSS REFERENCE TO RELATED APPLICATIONS

This application is a U.S. National Phase of International Patent Application No. PCT/JP2019/041165 filed on Oct. 18, 2019, which claims priority benefit of Japanese Patent Application No. JP 2018-211386 filed in the Japan Patent Office on Nov. 9, 2018. Each of the above-referenced applications is hereby incorporated herein by reference in its entirety.

TECHNICAL FIELD

The present technology relates to a solid-state imaging device and an electronic device.

BACKGROUND ART

In recent years, demand has been increasing more and more for solid-state imaging devices (image sensors) that are core components of digital cameras. For example, in a solid-state imaging device of a Complementary Metal Oxide Semiconductor (CMOS) image sensor, it is being studied to read pixel signals constituting image data with high accuracy.

Furthermore, for image data output from the solid-state imaging device, output of a high-definition image is required due to improvement of information processing technology. Thus, for example, a technology is also being studied related to a solid-state imaging device capable of supporting output of a variety of image data (see Patent Document 1).

CITATION LIST

Patent Document

Patent Document 1: WO 2015/133323 A

SUMMARY OF THE INVENTION

Problems to be Solved by the Invention

By the way, in the solid-state imaging device, vertical signal lines are wired from a pixel area to a column area. In the vertical signal lines, wiring pitch is converted by replacing the width of the pixel array unit with the width of the column area. Here, in a solid-state imaging device having a large chip size, the size of the column area is also increased, and a current source may be required for supplying a power source to the vertical signal lines.

For this reason, as the pixel size is increased, the column area is increased, and the wiring lengths of the vertical signal lines to the column area become longer. As a result, as the wiring lengths of the vertical signal lines to the column area become longer, a difference has occurred in resistance values of the vertical signal lines adjacent to the current source. Then, due to that the difference occurs in the resistance values of the vertical signal lines, unevenness has occurred in a captured image.

Thus, the present technology has been made in view of such a situation, and it is a main object to provide a solid-state imaging device and an electronic device capable of improving image quality of the captured image even if the pixel size is increased.

Solutions To Problems

As a result of diligent research to solve the above-mentioned object, the present inventor has succeeded in improving the image quality even if the pixel size is increased, and has completed the present technology.

That is, in the present technology, first, a solid-state imaging device is provided that includes:

at least two column areas that perform Analog To Digital (AD) conversion of a pixel signal generated by a pixel;

a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

In the solid-state imaging device according to the present technology, out of the two vertical signal lines, one of the vertical signal lines may be wired in parallel along a substantial center line of a current source forming the free area, and bent, and a resistance value of the one vertical signal line and a resistance value of another of the vertical signal lines may be substantially equivalent to each other.

In the solid-state imaging device according to the present technology, at least one current source may be included that is provided between the two column areas and supplies a power source. Moreover, in the present technology, the current source may include a load MOS transistor.

In the solid-state imaging device according to the present technology, a plurality of the two vertical signal lines may be included, a plurality of the vertical signal lines different from the two vertical signal lines may be wired between the one vertical signal line and the other vertical signal line, and intervals from the one vertical signal line to the other vertical signal line sandwiching the wired plurality of vertical signal lines may be substantially equal intervals, respectively.

In the solid-state imaging device according to the present technology, out of the two vertical signal lines, one of the vertical signal lines may be connected to one of the two column areas, and another of the vertical signal lines may be connected to another of the column areas arranged via a current source that supplies a power source to the two column areas, and the free area may be an isosceles triangle, and each of the two vertical signal lines may be arranged to be along a corresponding one of the two equal sides of the isosceles triangle.

In the solid-state imaging device according to the present technology, a plurality of current sources may be further included, in which each of the plurality of current sources is provided one each between two of the column areas, the plurality of vertical signal lines is wired such that intervals between the adjacent plurality of vertical signal lines are equal intervals, respectively, toward at least one current source among the plurality of current sources, and the free area is an isosceles triangle, and each of the two vertical signal lines is arranged to be along a corresponding one of the two equal sides of the isosceles triangle.

Furthermore, in the present technology, an electronic device is provided that includes a solid-state imaging device, in which the solid-state imaging device includes: at least two column areas that perform Analog To Digital (AD) conversion of a pixel signal produced by a pixel;

a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

Effects of the Invention

According to the present technology, it is possible to improve the image quality of the captured image even if the pixel size is increased. Note that, the effect of the present technology is not necessarily limited to the effect described above, and may be any effect described in the present technology.

MODE FOR CARRYING OUT THE INVENTION

Hereinafter, preferred embodiments for carrying out the present technology will be described with reference to the drawings. Note that, the embodiments described below are examples of representative embodiments of the present technology, and the scope of the present technology should not be construed narrowly.

Note that, the description will be made in the following order.

1. Overview of the present technology
2. First embodiment (first example of solid-state imaging device)
3. Second embodiment (second example of solid-state imaging device)
4. Third embodiment relating to electronic device
5. Usage examples of solid-state imaging device to which the present technology is applied 1. Overview of the Present Technology First, an overview of the present technology will be described. The present technology relates to a solid-state imaging device and an electronic device in which wiring pitch is converted in a pitch conversion area. According to the present technology, image quality of a captured image can be improved.

In vertical signal lines of the solid-state imaging device, the wiring pitch is generally converted by replacing the width of a pixel area with the width of a column area in the pitch conversion area. Furthermore, in recent years, in a solid-state imaging device having a large chip size such as large size, the size of the column area also becomes large, and a current source (load MOS transistor) is required such as a repeater for supplying a power source in the middle of a wiring line.

Furthermore, as the pixel size increases, not only the column area but also an area of the current source (load MOS transistor) increases. For this reason, the wiring lengths of the vertical signal lines to the column area become longer, and as the wiring lengths of the vertical signal lines to the column area become longer, a difference occurs in resistance values of the vertical signal lines adjacent to the current source (load MOS transistor). As a result, there has been a problem that the longer the wiring lengths of the vertical signal lines, the more the difference occurs in the resistance values of the vertical signal lines, and the difference is visible in the captured image.

Figure 17:
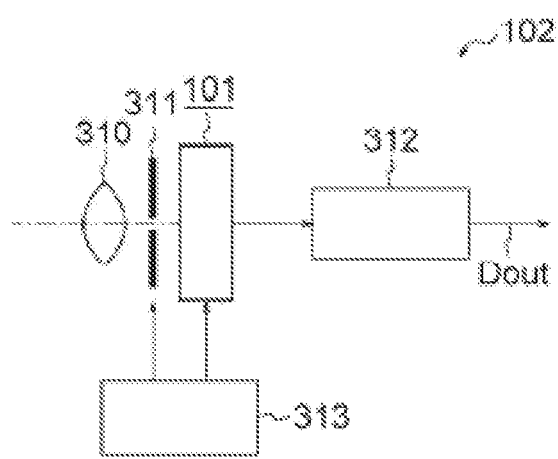
FIG. 17 is a functional block diagram of an example of an electronic device to which the present technology is applied.
Figure 18:
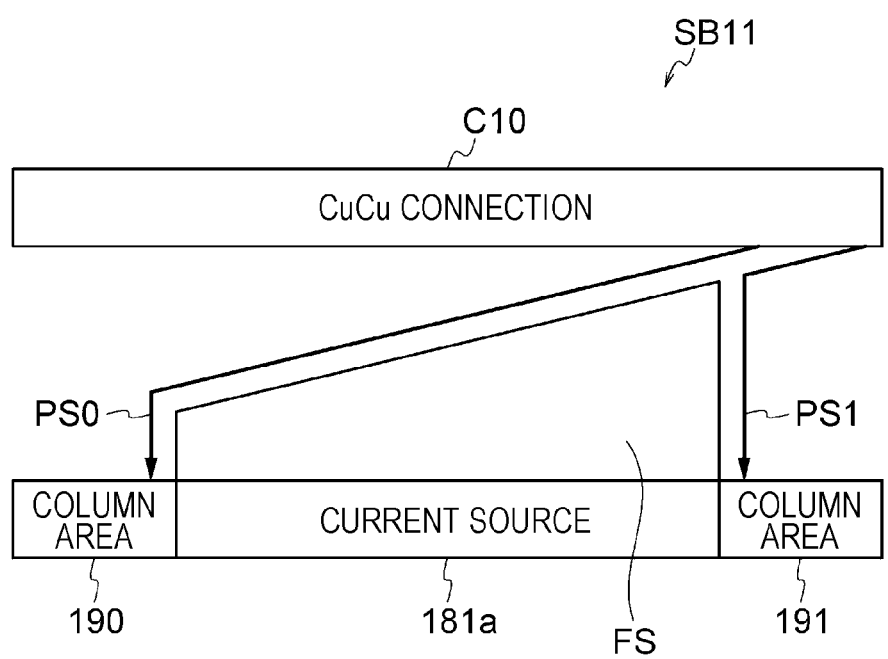
FIG. 18 is an explanatory diagram illustrating a method for wiring conventional vertical signal lines.

FIG. 18 illustrates a method for wiring conventional vertical signal lines. FIG. 18 is an explanatory diagram illustrating the method for wiring the conventional vertical signal lines. Unless otherwise specified, "up" indicates "up" of FIG. 17, and "right" indicates "right" of FIG. 18.

As illustrated in FIG. 18, a semiconductor substrate SB11 includes a CuCu connection C10, a column area 190, a current source 181a, a column area 191 and a free area FS.

The CuCu connection C10 bonds a semiconductor substrate (a pixel chip not illustrated) on which a pixel array unit is formed to the semiconductor substrate SB11 with copper (Cu). Note that, in the pixel array unit, pixels are arranged two-dimensionally. Furthermore, the free area FS is an area in which a plurality of vertical signal lines is not wired.

Each of a vertical signal line PS0 and a vertical signal line PS1 is connected from the CuCu connection C10 to the column area 190 or the column area 191. Specifically, the vertical signal line PS0 is connected from the CuCu connection C10 to the column area 190 via the free area FS. Furthermore, the vertical signal line PS1 is connected from the CuCu connection C10 to the column area 191. Between the column area 190 and the column area 191, a current source 181a is provided. The current source 181a supplies a current as a power source to the column area 190 and the column area 191. The current source 181a includes, for example, a load Metal Oxide Semiconductor (MOS) transistor.

Here, the longer the lateral width (width in the left-right direction) of the current source 181a, the greater the difference in wiring length between the vertical signal line PS0 and the vertical signal line PS1. When a difference occurs in the wiring length between the vertical signal line PS0 and the vertical signal line PS1, a difference in resistance increases between the vertical signal line PS0 and the vertical signal line PS1.

Figure 19:
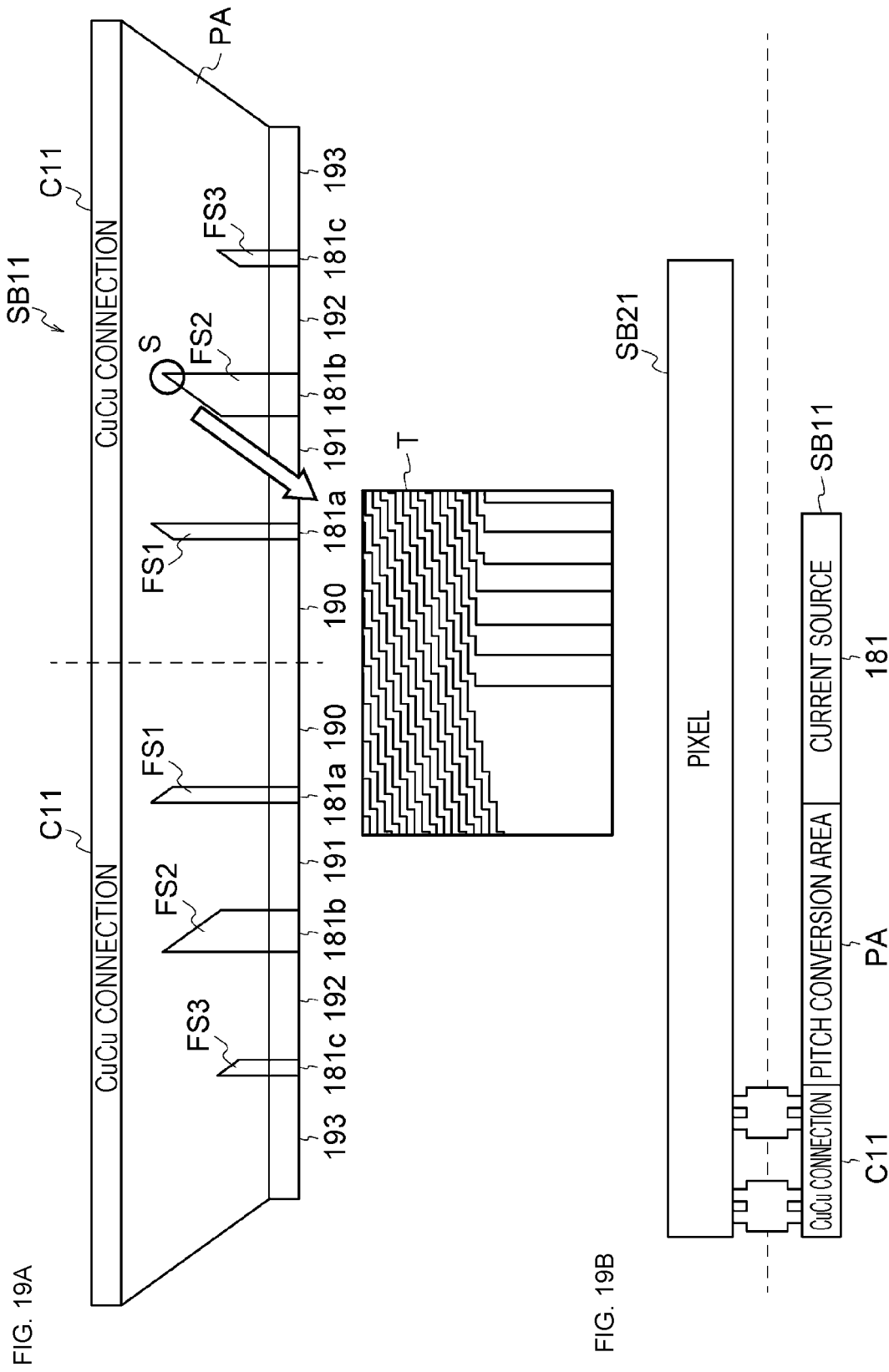
FIGS. 19A and 19B are schematic diagrams of a semiconductor substrate on which the conventional vertical signal lines are wired.

FIGS. 19A and 19B illustrate a schematic diagram of a semiconductor substrate on which the conventional vertical signal lines are wired. FIGS. 19A and 19B are schematic diagrams of the semiconductor substrate SB11 on which the conventional vertical signal lines are wired. FIG. 19A illustrates a top view of the semiconductor substrate SB11 on which the conventional vertical signal lines are wired. FIG. 19B illustrates a cross-sectional view of the semiconductor substrate SB11 on which the conventional vertical signal lines are wired. Note that, the same members as those in FIG. 18 are designated by the same reference numerals, and the description thereof will be omitted as appropriate.

As illustrated in FIG. 19A, the semiconductor substrate SB11 includes a CuCu connection C11, a pitch conversion area PA, the column area 190, the current source 181a, the column area 191, a current source 181b, a column area 192, a current source 181c, a column area 193, a free area FS1, a free area FS2, and a free area FS3.

The pitch conversion area PA is an area in which the width of the vertical signal line is converted from the CuCu connection C11 to the column area 190, the column area 191, the column area 192, and the column area 193. The free area FS1, the free area FS2, and the free area FS3 are areas in which a plurality of vertical signal lines is not wired.

An area T in FIG. 19A is a partially enlarged view of an area S that is a part of the pitch conversion area PS. The area T indicates that the vertical signal lines wired in the pitch conversion area PA are wired in a zigzag manner. This indicates that the free area FS2 in which the vertical signal lines are not wired is formed in the pitch conversion area PA corresponding to the current source 181b.

FIG. 19B illustrates a cross-sectional view of a semiconductor substrate including a semiconductor substrate SB21 and the semiconductor substrate SB11. The semiconductor substrate SB21 constitutes a pixel chip, and the semiconductor substrate SB11 constitutes a logic chip. The pixel array unit is formed on the semiconductor substrate SB21. In the pixel array unit, a plurality of pixels is arranged two-dimensionally in the row direction and the column direction. The semiconductor substrate SB11 includes the CuCu connection C11, the pitch conversion area PA, and a current source 181. The semiconductor substrate SB11 acquires a pixel signal generated by a pixel of the pixel array unit of the semiconductor substrate SB21 via the CuCu connection C10.

Figure 20:
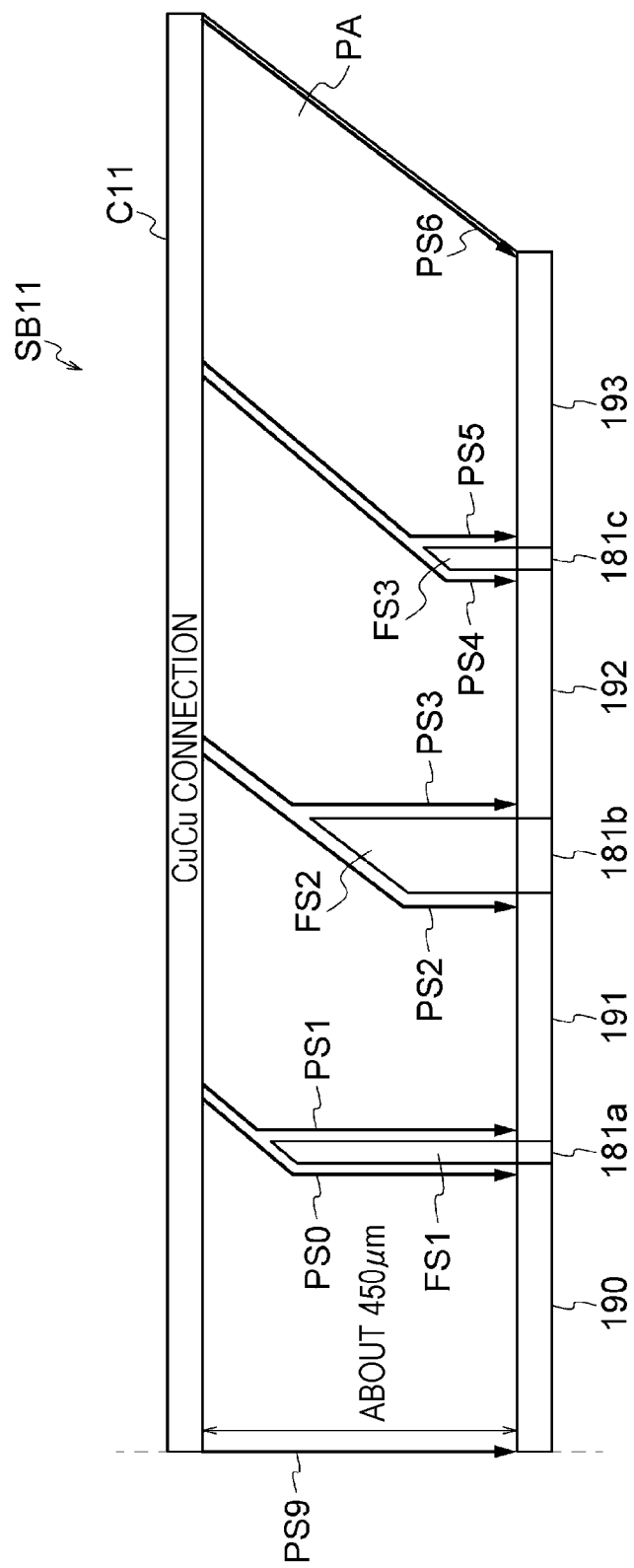
FIG. 20 is a plan view of the semiconductor substrate on which the conventional vertical signal lines are wired.

FIG. 20 illustrates a plan view of the semiconductor substrate on which the conventional vertical signal lines are wired. FIG. 20 is the plan view of the semiconductor substrate on which the conventional vertical signal lines are wired. Note that, the same members as the members illustrated in FIGS. 19A and 19B are designated by the same reference numerals, and the description thereof will be omitted as appropriate.

As illustrated in FIG. 20, the semiconductor substrate SB11 includes the CuCu connection C11, the column area 190, the current source 181a, the column area 191, the current source 181b, the column area 192, the current source 181c, the column area 193, the free area FS1, the free area FS2, and the free area FS3.

For example, the vertical signal line PS0 is connected from the CuCu connection C11 to the column area 190 via the free area FS1, and the resistance value is 5.34 [kΩ]. The vertical signal line PS1 is connected from the CuCu connection C11 to the column area 191, and the resistance value is 4.23 [kΩ]. Furthermore, a vertical signal line PS2 is connected from the CuCu connection C11 to the column area 191 via the free area FS2, and the resistance value is 7.67 [kΩ]. A vertical signal line PS3 is connected from the CuCu connection C11 to the column area 192, and the resistance value is 2.77 [kΩ]. Furthermore, a vertical signal line PS4 is connected from the CuCu connection C11 to the column area 192 via the free area FS3, and the resistance value is 6.20 [kΩ]. A vertical signal line PS5 is connected from the CuCu connection C11 to the column area 193, and the resistance value is 5.10 [kΩ].

Figure 21:
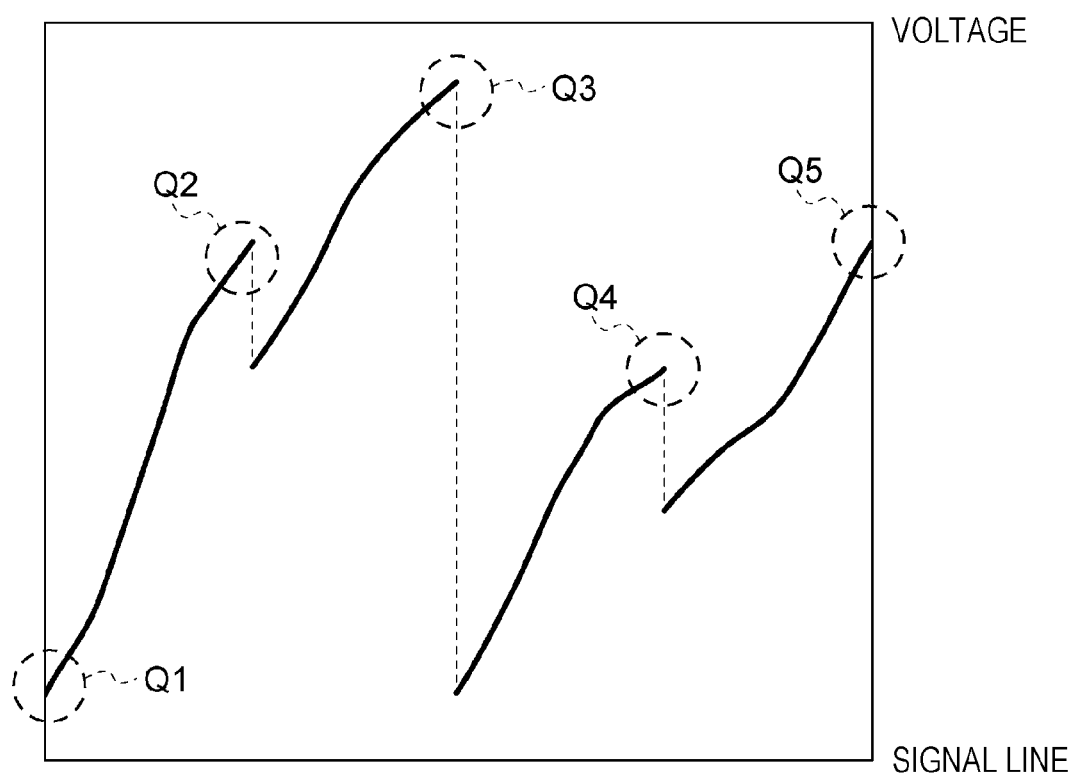
FIG. 21 is an explanatory diagram illustrating voltages corresponding to the vertical signal lines.

FIG. 21 illustrates voltages corresponding to the vertical signal lines illustrated in FIG. 20. FIG. 21 is an explanatory diagram illustrating the voltages corresponding to the respective vertical signal lines illustrated in FIG. 20. Note that, the horizontal axis of FIG. 21 corresponds to the horizontal axis in which the column area 190, the column area 191, the column area 192, and the column area 193 of FIG. 20 are arranged.

In FIG. 21, the voltage of each vertical signal line is indicated, an area where the voltage is high indicates that the resistance value is high, and an area where there is a difference in voltage indicates that the difference in resistance value is large.

For example, an area Q1 in FIG. 21 corresponds to a vertical signal line PS9 in the column area 190 in FIG. 20. The voltage of the vertical signal line PS9 is lower than an average voltage in FIG. 21. An area Q2 in FIG. 21 corresponds to the vertical signal line PS0 in FIG. 20. The voltage of the vertical signal line PS0 is high, and the voltage of the adjacent vertical signal line PS1 is low. In this case, since there is a difference in the wiring length between the vertical signal line PS0 and the vertical signal line PS1, it is indicated that there is a difference in the resistance value.

An area Q3 in FIG. 21 corresponds to the vertical signal line PS2 in FIG. 20. The voltage of the vertical signal line PS2 is high, and the voltage of the adjacent vertical signal line PS3 is low. In this case, since there is a further difference in the wiring length between the vertical signal line PS0 and the vertical signal line PS1, it is indicated that there is a further difference in the resistance value.

An area Q4 in FIG. 21 corresponds to the vertical signal line PS4 in FIG. 20. The voltage of the vertical signal line PS4 is high, and the voltage of the adjacent vertical signal line PS5 is low. In this case, since there is a difference in the wiring length between the vertical signal line PS4 and the vertical signal line PS5, it is indicated that there is a difference in the resistance value. An area Q5 in FIG. 21 corresponds to a vertical signal line PS6 in FIG. 20. The voltage of the vertical signal line PS6 is higher than the average voltage in FIG. 21.

As described above, FIG. 21 illustrates that the difference occurs in the resistance value at a location where there is the difference in the wiring length of the vertical signal line. Then, this difference in resistance value affects the P-phase distribution image.

Figure 22:
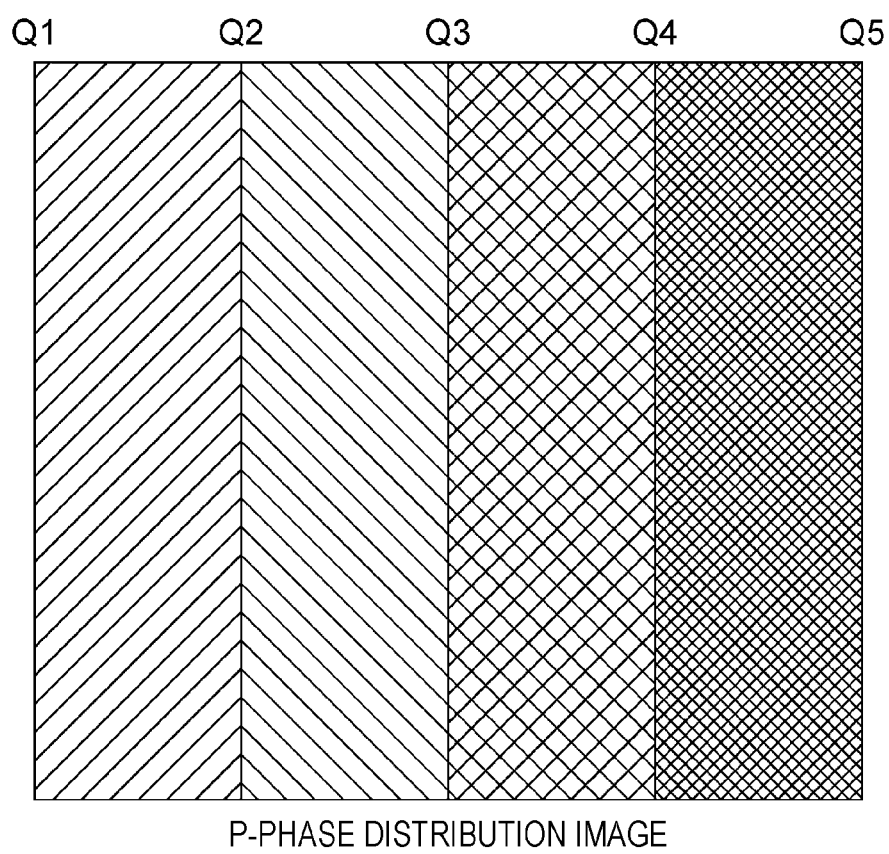
FIG. 22 is an explanatory diagram illustrating a P-phase distribution image in a state where the conventional vertical signal lines are wired.

FIG. 22 illustrates the P-phase distribution image in a state where the conventional vertical signal lines are wired. FIG. 22 is an explanatory diagram illustrating the P-phase distribution image in the state where the conventional vertical signal lines are wired. Note that, the same members as the members illustrated in FIG. 21 are designated by the same reference numerals, and the description thereof will be omitted as appropriate.

FIG. 22 illustrates the P-phase distribution image in which P-phase pixel signals are read in the areas Q1 to Q5. The P-phase distribution image of FIG. 22 indicates that a step occurs in the image in, for example, the area Q2, the area Q3, and the area Q4 where the difference exists in the resistance values of the vertical signal lines, and there is unevenness.

The present technology has been made in view of the circumstances described above, and it is possible to eliminate the unevenness in the image and improve the image quality of the captured image even if the pixel size is increased.

2. First Embodiment (First Example of Solid-State Imaging Device)

A solid-state imaging device of a first embodiment according to the present technology is a solid-state imaging device including: at least two column areas that perform Analog To Digital (AD) conversion of a pixel signal generated by a pixel; a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

According to the solid-state imaging device of the first embodiment according to the present technology, resistance values of the vertical signal lines from the CuCu connection to the column areas are substantially equivalent to each other, so that image quality of a captured image can be improved.

[Overall Configuration of Solid-State Imaging Device of First Embodiment]

Figure 1:
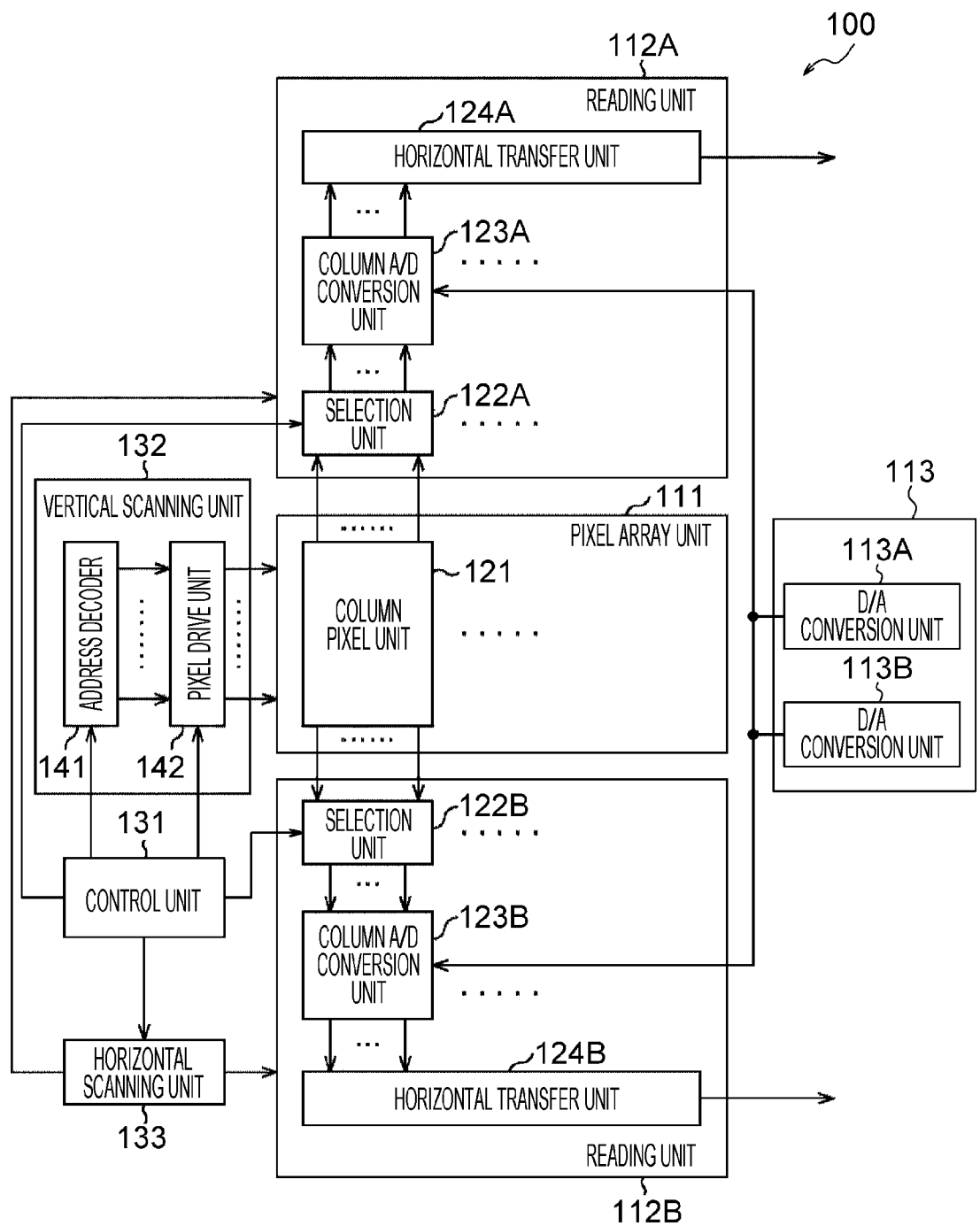
FIG. 1 is a block diagram illustrating a main configuration example of an image sensor to which the present technology is applied.

FIG. 1 illustrates a solid-state imaging device 100 that is an example of the solid-state imaging device of the first embodiment according to the present technology. FIG. 1 is a block diagram illustrating a configuration example of a part of a Complementary Metal Oxide Semiconductor (CMOS) image sensor that is an embodiment of a solid-state imaging device to which the present technology is applied. Note that, unless otherwise specified, "up" means the upward direction in each figure, and "right" means the right direction in each figure. Furthermore, the same members as the members described are designated by the same reference numerals, and the description thereof will be omitted as appropriate.

The solid-state imaging device 100 illustrated in FIG. 1 is an imaging device that captures an image of a subject and obtains digital data of the captured image. Note that, in this specification, a CMOS image sensor will be described as an example, but the present technology can also be applied to an imaging device other than the CMOS image sensor, for example, a Charge Coupled Device (CCD) image sensor or the like.

As illustrated in FIG. 1, the solid-state imaging device 100 includes a pixel array unit 111, a reading unit 112A, a reading unit 112B, a control unit 131, a vertical scanning unit 132, a horizontal scanning unit 133, and a D/A conversion unit 113.

In the pixel array unit 111, a plurality of pixels is arranged two-dimensionally in the row direction and the column direction. The pixel array unit 111 is a pixel area in which a pixel configuration (unit pixel) including a photoelectric conversion element such as a photodiode is arranged in a plane. Each unit pixel of the pixel array unit 111 receives light from a subject, photoelectrically converts the incident light, and stores electric charge. Then, each unit pixel of the pixel array unit 111 outputs the electric charge as a pixel signal at a predetermined timing. The pixel signal generated by each unit pixel of the pixel array unit 111 is transferred from a column pixel unit 121 via a selection unit 122A to a column A/D conversion unit 123A of the reading unit 123A, via vertical signal lines (see FIGS. 2, 3, 4, 5A, and 5B, and the like).

The vertical signal lines (see FIGS. 2, 3, 4, 5A, and 5B, and the like) that transfer pixel signals are assigned to each column (column) of unit pixels. Furthermore, operation related to reading of the pixel signals is controlled for each line (row) of unit pixels. As a result, each unit pixel of the pixel array unit 111 transfers the pixel signal generated by each unit pixel to a column A/D conversion unit 123B via the vertical signal lines (see FIGS. 2, 3, 4, 5A, and 5B, and the like). Note that, the vertical signal lines from column pixels 121A to the selection unit 122A are designated as a vertical signal line VSL0, a vertical signal line VSL1, a vertical signal line VSL2, and a vertical signal line VSL3 (see FIG. 2). Furthermore, the vertical signal lines from the selection unit 122A to the column A/D conversion unit 123A are designated as a vertical signal line VSLA0 and a vertical signal line VSLA1 (see FIGS. 5A and 5B).

The pixel array unit 111 includes as many column pixel units 121 as the number of columns, the column pixel units 121 each being a configuration for one column (column) of unit pixels. In FIG. 1, only the configuration for one column (column) is illustrated, but, for example, in a case where the pixel array unit 111 includes unit pixels of P (P is a natural number) columns, the pixel array unit 111 includes P column pixel units 121. The column pixel unit 121 includes a plurality of (for example, N (N is a natural number of greater than or equal to 2)) vertical signal lines (see FIG. 2) that transfers pixel signals output from unit pixels of the column. That is, the column pixel unit 121 can output the plurality of (for example, N) pixel signals in parallel.

The control unit 131 has a function of controlling operation of each processing unit of the solid-state imaging device 100. The control unit 131 controls the vertical scanning unit 132 and the horizontal scanning unit 133 to output pixel signals from the pixel array unit 111.

The vertical scanning unit 132 is controlled by the control unit 131 to drive each unit pixel of each column of the pixel array unit 111 for each line (row), and output pixel signals from each column of the pixel array unit 111. Furthermore, the vertical scanning unit 132 includes an address decoder 141 and a pixel drive unit 142.

The address decoder 141 decodes address designation information supplied from the control unit 131, and supplies a control signal to a configuration corresponding to a designated address of the pixel drive unit 142.

The pixel drive unit 142 is controlled by the control unit 131 to supply a control signal for driving each unit pixel of the pixel array unit 111. The pixel drive unit 142 has a configuration that supplies the control signal for each line of the pixel array unit 111. The pixel drive unit 142 supplies a control signal corresponding to a control content designated by the control unit 131 to each unit pixel of a designated line of the pixel array unit 111 in the configuration designated by the address decoder 141. Note that, hereinafter, this control signal may also be referred to as a pixel control signal.

The reading unit 112A includes the selection unit 122A, the column A/D conversion unit 123A, and a horizontal transfer unit 124A. The reading unit 112A reads a pixel signal from each unit pixel of the pixel array unit 111, performs signal processing such as A/D conversion, and outputs the pixel signal. The reading unit 112A includes the selection unit 122A and the column A/D conversion unit 123A for each column (each column pixel unit 121) of the pixel array unit 111. In FIG. 1, only the configuration for one column (column) is illustrated, but, for example, in a case where the pixel array unit 111 includes unit pixels of P columns, the reading unit 112A includes P selection units 122A and P column A/D conversion units 123A.

The selection unit 122A selects a signal line that supplies a pixel signal to the column/AD conversion unit 123A from among a plurality of (for example, N) vertical signal lines of the column pixel unit 121 corresponding to the selection unit 122A. In this case, the selection unit 122A controls connections between the vertical signal lines of the column pixel unit 121 and the column A/D conversion unit 123A.

The column A/D conversion unit 123A performs A/D-conversion of a pixel signal (analog data) transferred from the column pixel unit 121 via the selection unit 122A corresponding to the column A/D conversion unit 123A. The column A/D conversion unit 123A includes a plurality of (for example, M (M is a natural number of greater than or equal to 2. however, M≤N)) A/D conversion units, and can perform A/D conversion of a plurality of (for example, M) pixel signals transferred via the selection unit 122A in parallel. As a result, the selection unit 122A can select, for example, M vertical signal lines from N vertical signal lines, and connect the selected vertical signal lines to the column A/D conversion unit 123A.

The column A/D conversion unit 123A performs A/D-conversion of the pixel signal by using a ramp signal supplied from the D/A conversion unit 113. Note that, the column A/D conversion unit 123A includes a column area and a current source not illustrated in FIG. 1. The column area and current source will be described later with reference to FIG. 10.

The horizontal transfer unit 124A sequentially outputs a pixel signal (digital data) output from each column A/D conversion unit 123A, that is, a pixel signal of each column of the pixel array unit 111. For example, in a case where the pixel array unit 111 includes unit pixels of P columns and each column A/D conversion unit 123A includes M A/D conversion units, P×M pixel signals are supplied to the horizontal transfer unit 124A in parallel. The horizontal transfer unit 124A sequentially transfers the P×M pixel signals. The pixel signals output from the horizontal transfer unit 124A are supplied to, for example, a processing unit (not illustrated) such as a signal processing unit connected to a subsequent stage. The processing unit in the subsequent stage may be provided inside the solid-state imaging device 100, or may be provided outside.

The reading unit 112B is a processing unit that performs processing similar to that by the reading unit 112A, and has a configuration similar to that of the reading unit 112A. That is, the reading unit 112B includes a selection unit 122B and a column A/D conversion unit 123B for each column of unit pixels of the pixel array unit 111. The selection unit 122B is a processing unit that performs processing similar to that by the selection unit 122A, and has a configuration similar to that of the selection unit 122A. The column A/D conversion unit 123B is a processing unit that performs processing similar to that by the column A/D conversion unit 123A, and has a configuration similar to that of the column A/D conversion unit 123A. The reading unit 112B includes a horizontal transfer unit 124B. The horizontal transfer unit 124B is a processing unit that performs processing similar to that by the horizontal transfer unit 124A, and has a configuration similar to that of the horizontal transfer unit 124A.

In the following, in a case where it is not necessary to give a description by distinguishing the reading unit 112A and the reading unit 112B from each other, they are each simply referred to as a reading unit 112. Similarly, in a case where it is not necessary to give a description by distinguishing the selection unit 122A and the selection unit 122B from each other, they are each simply referred to as a selection unit 122. Similarly, in a case where it is not necessary to give a description by distinguishing the column A/D conversion unit 123A and the column A/D conversion unit 123B from each other, they are each simply referred to as a column A/D conversion unit 123. Similarly, in a case where it is not necessary to give a description by distinguishing the horizontal transfer unit 124A and the horizontal transfer unit 124B from each other, they are each simply referred to as a horizontal transfer unit 124.

The D/A conversion unit 113 supplies a predetermined ramp signal to the column A/D conversion unit 123. As an example, the D/A conversion unit 113 includes two D/A conversion units, that is, a D/A conversion unit 113A and a D/A conversion unit 113B. For this reason, the D/A conversion unit 113 can supply two ramp signals. Note that, the D/A conversion unit 113 is not limited to the two D/A conversion units 113, and can be changed depending on the number of ramp signals.

The solid-state imaging device 100 of the first embodiment illustrated in FIG. 1 described above includes two systems of routes that output pixel signals from the pixel array unit 111. That is, in the case of FIG. 1, the reading unit 112 includes the reading unit 112A and the reading unit 112B. The number of routes is arbitrary, and there may be one system, or may be three or more systems.

Figure 2:
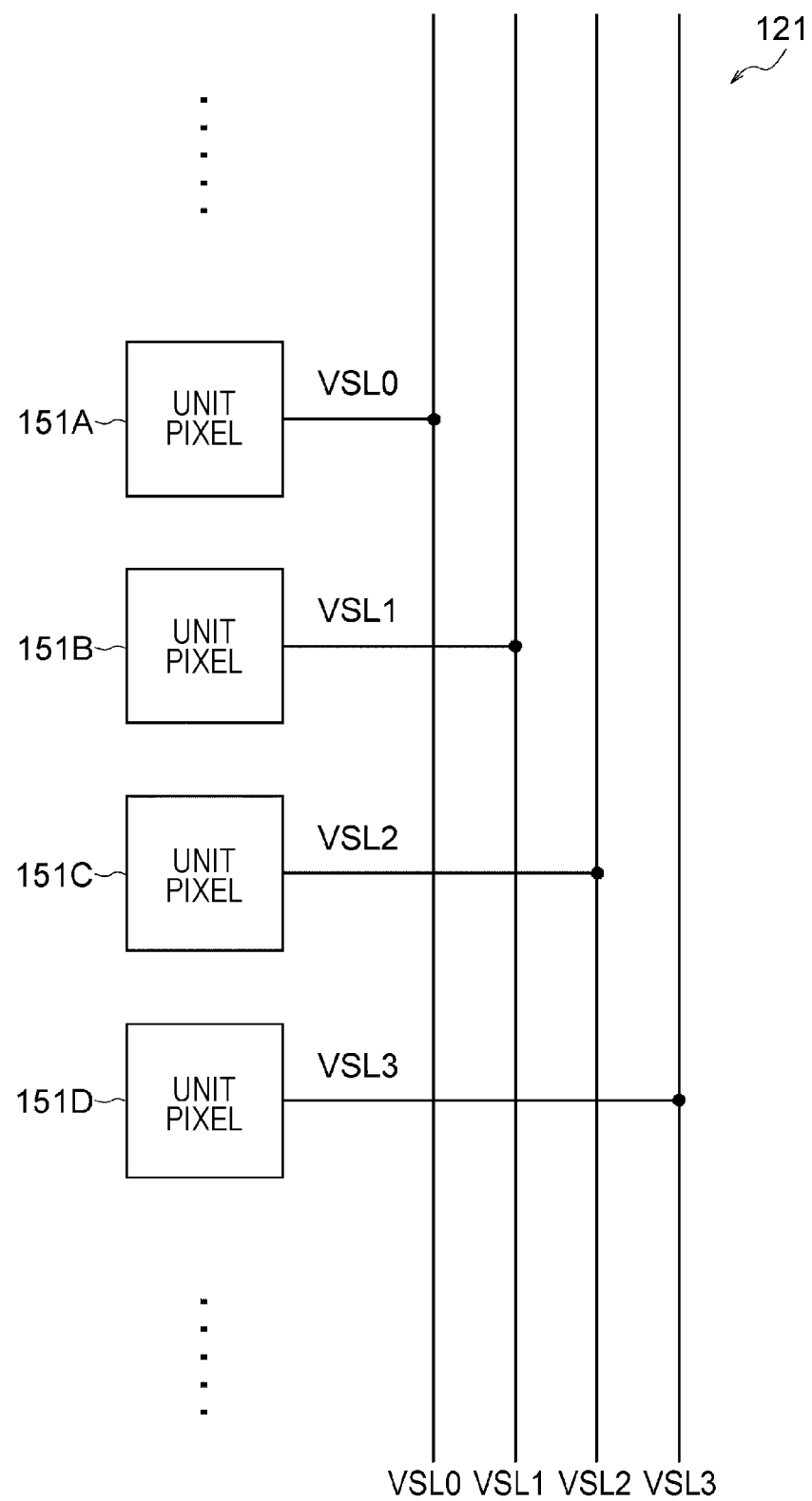
FIG. 2 is a diagram illustrating a main configuration example of a column pixel unit.

FIG. 2 illustrates an example of a main configuration of the column pixel unit 121. As described above, the plurality of (for example, N (N is a natural number of greater than or equal to 2)) vertical signal lines is assigned to the column pixel unit 121. Each unit pixel of the column pixel unit 121 (that is, each unit pixel of the column of the pixel array) is connected to any of the plurality of vertical signal lines. Furthermore, the number of unit pixels of the column pixel unit 121 is arbitrary.

In the case of FIG. 2, four vertical signal lines (VSL0, VLS1, VSL2, VSL3) are assigned, and four unit pixels (unit pixel 151A, unit pixel 151B, unit pixel 151C, unit pixel 151D) are illustrated. The unit pixel 151A is connected to the vertical signal line VSL0. The unit pixel 151B is connected to the vertical signal line VSL1. The unit pixel 151C is connected to the vertical signal line VSL2. The unit pixel 151D is connected to the vertical signal line VSL3. In a case where the column pixel unit 121 includes five or more unit pixels, other unit pixels are similarly connected to any of the four vertical signal lines (VSL0, VLS1, VSL2, VSL3).

Note that, in the following, in a case where it is not necessary to give a description by distinguishing the unit pixels from each other, they are each simply referred to as a unit pixel 151. Furthermore, in a case where it is not necessary to give a description by distinguishing the vertical signal lines from each other, they are each simply referred to as a vertical signal line VSL.

Figure 3:
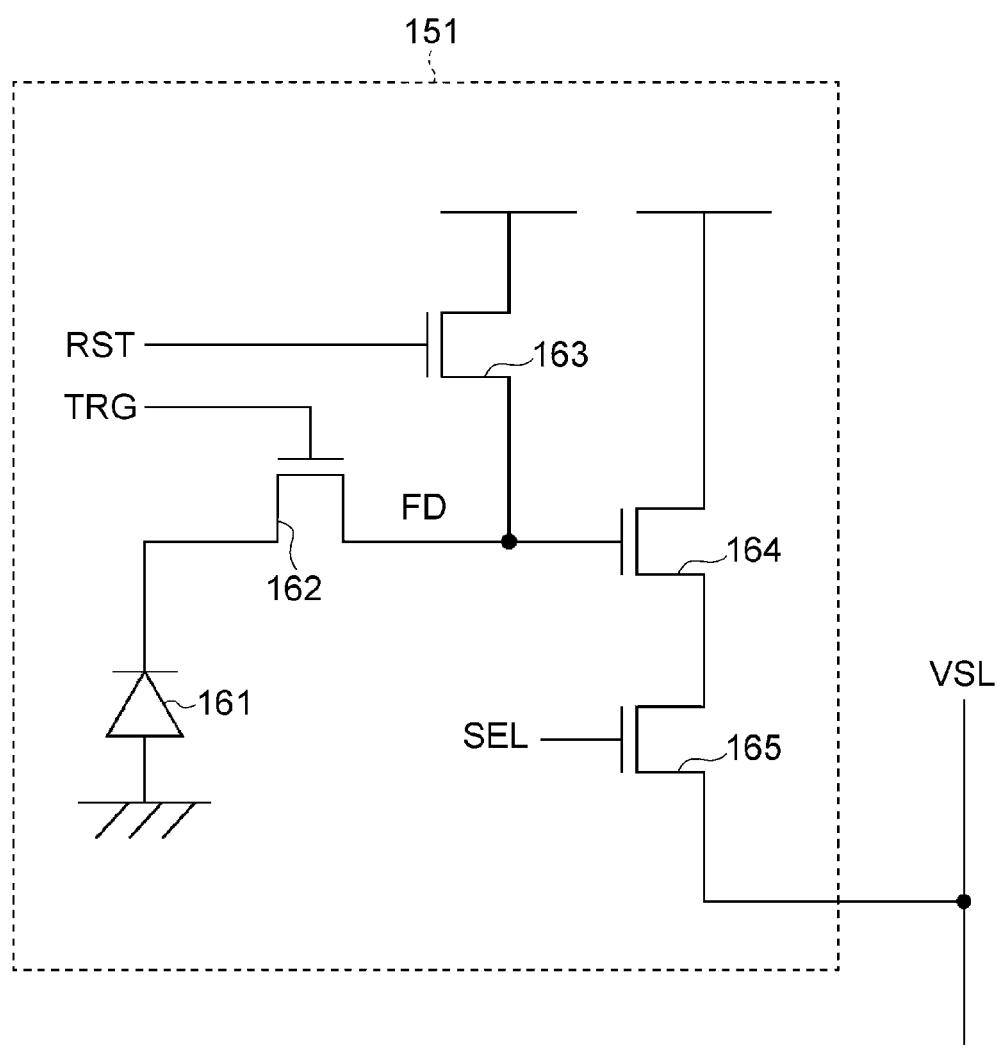
FIG. 3 is a diagram illustrating a main configuration example of a unit pixel.

FIG. 3 illustrates an example of a main configuration of the unit pixel 151. As illustrated in FIG. 3, the unit pixel 151 includes a photodiode 161, a read transistor 162, a reset transistor 163, an amplification transistor 164, and a selection transistor 165.

The photodiode 161 photoelectrically converts received light into optical charge having the amount of charge corresponding to the amount of light, and stores the optical charge. The anode electrode of the photodiode 161 is connected to the ground (pixel ground) of the pixel area, and the cathode electrode is connected to floating diffusion (FD) via the read transistor 162.

The read transistor 162 controls reading of the optical charge from the photodiode 161. In the read transistor 162, the drain electrode is connected to the floating diffusion, and the source electrode is connected to the cathode electrode of the photodiode 161. Furthermore, a control signal TRG is supplied from the pixel drive unit 142 to the gate electrode of the read transistor 162. When the control signal TRG (that is, a gate potential of the read transistor 162) is in the off state, the reading of the optical charge from the photodiode 161 is not performed (the optical charge is stored in the photodiode 161). When the control signal TRG (that is, the gate potential of the read transistor 162) is in the on state, the optical charge stored in the photodiode 161 is read, and supplied to the floating diffusion (FD).

The reset transistor 163 resets a potential of the floating diffusion (FD). In the reset transistor 163, the drain electrode is connected to a power source potential and the source electrode is connected to the floating diffusion (FD). Furthermore, a control signal RST is supplied from the pixel drive unit 142 to the gate electrode of the reset transistor 163. When the control signal RST (that is, a gate potential of the reset transistor 163) is in the off state, the floating diffusion (FD) is disconnected from the power source potential. When the control signal RST (that is, the gate potential of the reset transistor 163) is in the on state, the charge of the floating diffusion (FD) is discarded to the power source potential, and the floating diffusion (FD) is reset.

The amplification transistor 164 amplifies a potential change of the floating diffusion (FD), and outputs the amplified potential change as an electric signal (analog signal). In the amplification transistor 164, the gate electrode is connected to the floating diffusion (FD), the drain electrode is connected to the power source potential, and the source electrode is connected to the drain electrode of the selection transistor 165. For example, the amplification transistor 164 outputs the potential of the floating diffusion (FD) reset by the reset transistor 163 to the selection transistor 165 as a reset signal (reset level). Furthermore, the amplification transistor 164 outputs the potential of the floating diffusion (FD) to which the optical charge is transferred by the read transistor 162, to the selection transistor 165 as an optical storage signal (signal level).

The selection transistor 165 controls output of the electric signal supplied from the amplification transistor 164 to the vertical signal line VSL. In the selection transistor 165, the drain electrode is connected to the source electrode of the amplification transistor 164, and the source electrode is connected to the vertical signal line VSL. Furthermore, a control signal SEL is supplied from the pixel drive unit 142 to the gate electrode of the selection transistor 165. When the control signal SEL (that is, a gate potential of the selection transistor 165) is in the off state, the amplification transistor 164 and the vertical signal line VSL are electrically disconnected from each other.

Thus, in the off state, the pixel signal is not output from the unit pixel. When the control signal SEL (that is, the gate potential of the selection transistor 165) is in the on state, the unit pixel is in the selected state. That is, the amplification transistor 164 and the vertical signal line VSL are electrically connected to each other, and the signal output from the amplification transistor 164 is supplied to the vertical signal line VSL as a pixel signal of the unit pixel. That is, the pixel signal is read from the unit pixel.

Note that, the configuration of the unit pixel 151 is arbitrary, and is not limited to FIG. 3. For example, the read transistor 162 may be omitted. Furthermore, the number of pixels per unit pixel is arbitrary, and there may be one pixel as illustrated in FIG. 3, or may be a plurality of pixels.

Figure 4:
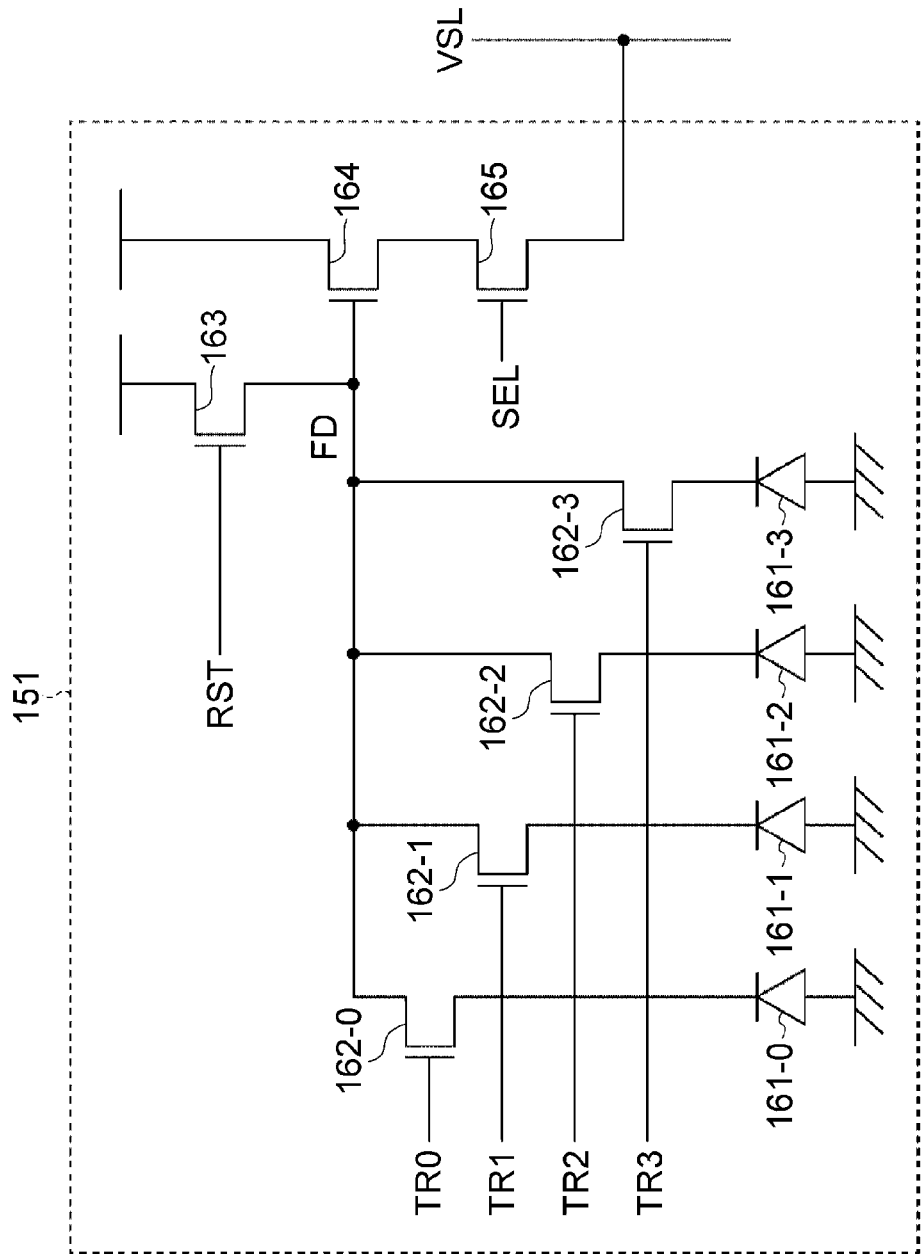
FIG. 4 is a diagram illustrating another configuration example of the unit pixel.

Here, FIG. 4 illustrates a configuration example of a unit pixel in a case where a plurality of pixels is included. In the example of FIG. 4, the unit pixel 151 includes four photodiodes 161 (photodiode 161-0, photodiode 161-1, photodiode 161-2, photodiode 161-3). In this case, the unit pixel 151 includes four pixels. The photodiodes 161 may have the same characteristics as each other, but may have different characteristics from each other. For example, some or all of these photodiodes 161 may photoelectrically convert incident light in a wavelength band different from the others.

For example, the photodiode 161-0 to photodiode 161-3 are arranged in two rows and two columns. In this case, the photodiode 161-0 on the upper left of the two rows and two columns photoelectrically converts a red (R) band. Furthermore, the photodiode 161-1 on the upper right of two rows and two columns photoelectrically converts a green (GR) band. Furthermore, the photodiode 161-2 on the lower left of the two rows and two columns photoelectrically converts a green (GB) band. Furthermore, the photodiode 161-3 on the lower right of the two rows and two columns photoelectrically converts a blue (B) band. As a result, the unit pixel 151 can be made to form one unit of a Bayer array.

Note that, the first embodiment is not limited to the Bayer array, and may be a form in which the same color is owned in common by the floating diffusion (FD).

Furthermore, in the case of FIG. 4, the unit pixel 151 includes four read transistors 162 (read transistor 162-0, read transistor 162-1, read transistor 162-2, read transistor 162-3).

The read transistor 162-0 controls reading of the optical charge from the photodiode 161-0 on the basis of the control signal TRG (TR0) supplied from the pixel drive unit 142. The read transistor 162-1 controls reading of the optical charge from the photodiode 161-1 on the basis of the control signal TRG (TR1) supplied from the pixel drive unit 142. The read transistor 162-2 controls reading of the optical charge from the photodiode 161-2 on the basis of the control signal TRG (TR2) supplied from the pixel drive unit 142. The read transistor 162-3 controls reading of the optical charge from the photodiode 161-3 on the basis of the control signal TRG (TR3) supplied from the pixel drive unit 142.

In the case of FIG. 4, configurations of the floating diffusion (FD), the reset transistor 163, the amplification transistor 164, the selection transistor 165, and the like are shared within a unit pixel. Then, pixel signals of respective pixel (photodiode 161-0, photodiode 161-1, photodiode 161-2, photodiode 161-3) each are transferred via the same vertical signal line VSL. In the following description, the description will be given with reference to FIG. 4 as the configuration of the unit pixel 151.

Figure 5:
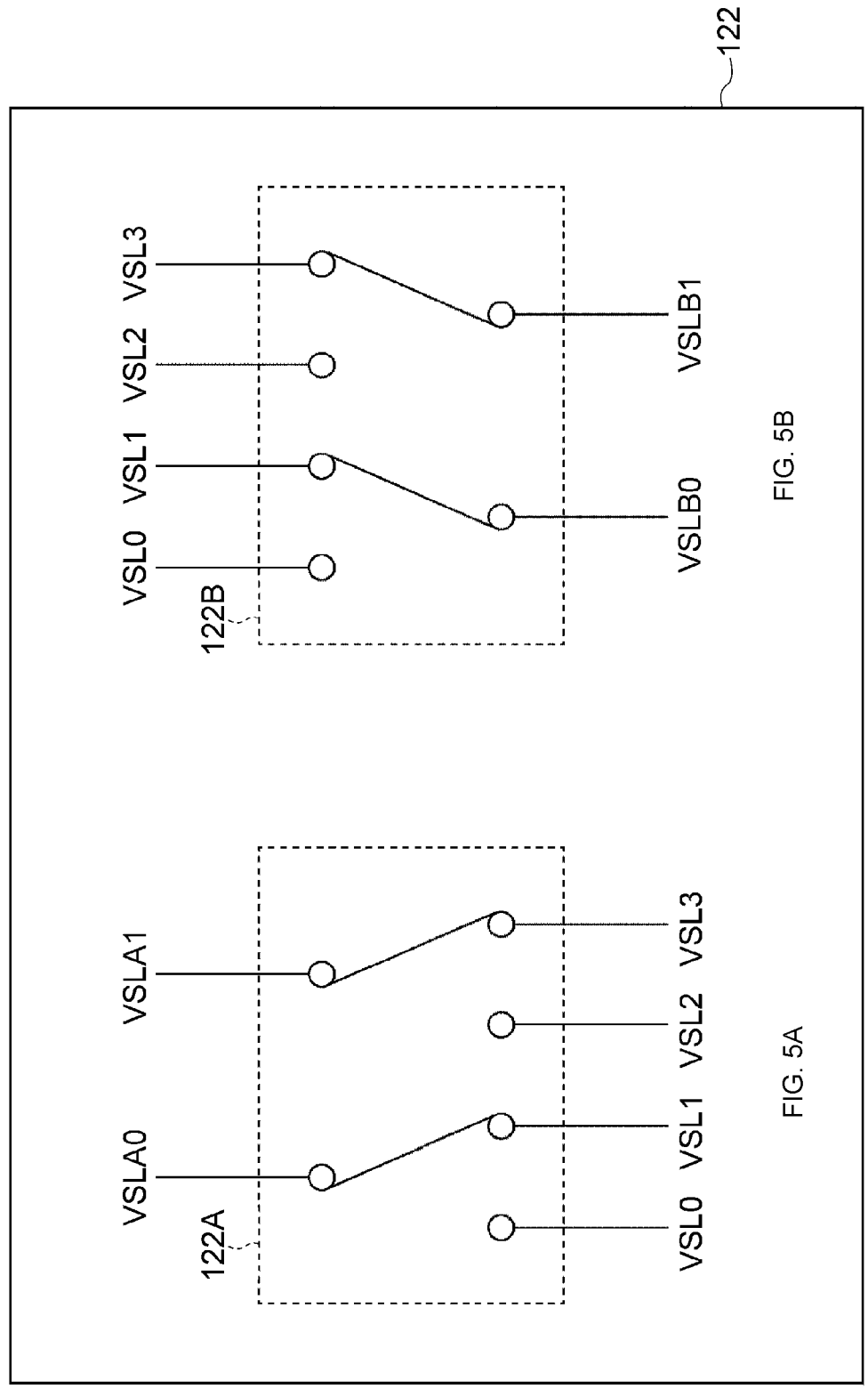
FIGS. 5A and 5B are diagrams illustrating a main configuration example of a selection unit.

FIGS. 5A and 5B are diagrams illustrating an example of a main configuration of the selection unit 122. FIG. 5A illustrates a configuration example of the selection unit 122A. FIG. 5B illustrates a configuration example of the selection unit 122B. The selection unit 122 is provided for each column pixel unit 121, and controls connections between the N vertical signal lines of the column pixel unit 121 and M systems of A/D conversion units (M vertical signal lines) of the column A/D conversion unit 123. In the case of the example of FIG. 5A, the selection unit 122A selects any two of the four vertical signal lines (VSL0 to VSL3) of the column pixel unit 121 corresponding to the selection unit 122A, and connects the selected vertical signal lines to the two vertical signal lines (VSLA0, VSLA1) of the column A/D conversion unit 123A.

The selection unit 122B has a configuration basically similar to that of the selection unit 122A. That is, in the case of the example of FIG. 5B, the selection unit 122B selects any two of the four vertical signal lines (VSL0, VSL1, VSL2, VSL3) of the column pixel unit 121 corresponding to the selection unit 122B, and connects the selected vertical signal lines to two vertical signal lines (VSLB0, VSLB1) of the column A/D conversion unit 123B.

Figure 6:
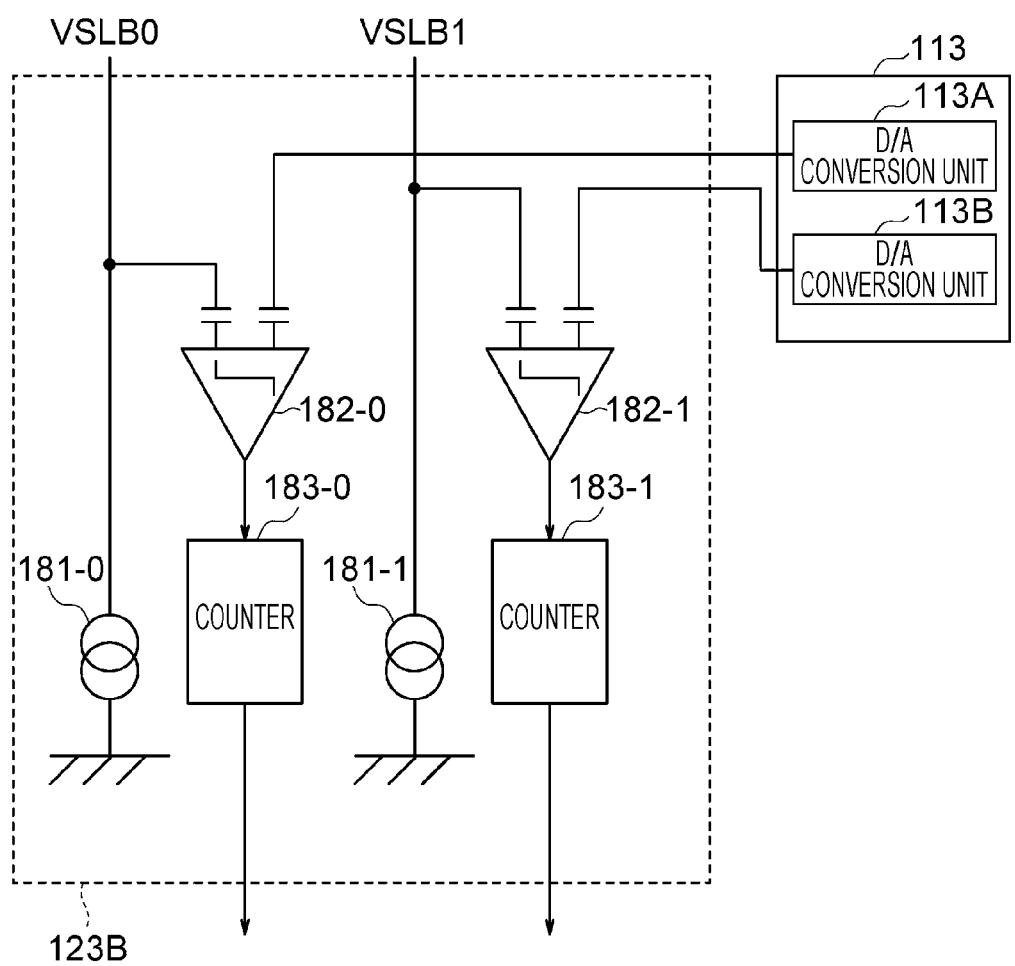
FIG. 6 is a diagram illustrating a main configuration example of a column A/D conversion unit.

FIG. 6 illustrates an example of a main configuration of the column A/D conversion unit 123B. The column A/D conversion unit 123B includes a current source 181-0, a comparator 182-0, a counter 183-0, a current source 181-1, a comparator 182-1, and a counter 183-1. The column A/D conversion unit 123 includes the M systems of A/D conversion units as described above. In the case of FIG. 6, two systems (VSLB0, VSLB1) of A/D conversion units are included. Then, the column A/D conversion unit 123B includes the current source 181-0, the comparator 182-0, and the counter 183-0 as the A/D conversion unit of the system of the vertical signal line VSLB0. The current source 181-0 represents a load of a peripheral circuit connected to the vertical signal line VSLB0. The current source 181-0 is connected to the vertical signal line VSLB0 and the ground. Note that, in this A/D conversion unit, configurations other than the current source 181-0, that is, the comparator 182-0 and the counter 183-0 are referred to as a column area. Furthermore, the current source 181-0 supplies a power source to the column area. The current source 181-0 includes, for example, a load Metal Oxide Semiconductor (MOS) transistor.

The D/A conversion unit 113 supplies a ramp signal to each system of the column A/D conversion unit 123B. In the case of FIG. 6, the D/A conversion unit 113 includes two D/A conversion units. Specifically, the D/A conversion unit 113 includes the D/A conversion unit 113A and the D/A conversion unit 113B. The D/A conversion unit 113A supplies a ramp signal to the A/D conversion unit of the system of the vertical signal line VSLB0.

The comparison unit 182-0 compares a pixel signal transferred from the unit pixel 151 of the pixel array unit 111 via the vertical signal line VSL, the selection unit 122B, and the vertical signal line VSLB0 with the ramp signal supplied from the D/A conversion unit 113A, and supplies a comparison result (information indicating which value is larger) to the counter 183-0.

The counter 183-0 counts a period from the start of counting until a value of the comparison result changes, and outputs the count value as digital data of the pixel signal to the horizontal transfer unit 124B when the value of the comparison result changes.

Furthermore, the column A/D conversion unit 123B includes the current source 181-1, the comparator 182-1, and the counter 183-1 as the A/D conversion unit of the system of the vertical signal line VSLB1. The current source 181-1 has a configuration similar to that of the current source 181-0. That is, the current source 181-1 represents a load of a peripheral circuit connected to the vertical signal line VSLB1. The current source 181-1 is connected to the vertical signal line VSLB1 and the ground. Note that, in this A/D conversion unit, configurations other than the current source 181-1, that is, the comparator 182-1 and the counter 183-1 are referred to as a column area. Furthermore, the current source 181-1 supplies a power source to the column area. The current source 181-1 includes, for example, a load Metal Oxide Semiconductor (MOS) transistor.

The D/A conversion unit 113B supplies a ramp signal to the A/D conversion unit of the system of the vertical signal line VSLB1.

The comparison unit 182-1 has a configuration similar to that of the comparison unit 182-0, and performs processing similar to that by the comparison unit 182-0. That is, the comparison unit 182-1 compares a pixel signal transferred from the unit pixel 151 of the pixel array unit 111 via the vertical signal line VSL, the selection unit 122B, and the vertical signal line VSLB1 with the ramp signal supplied from the D/A conversion unit 113B, and supplies a comparison result (information indicating which value is larger) to the counter 183-1.

The counter 183-1 has a configuration similar to that of the counter 183-0 and performs similar processing. That is, the counter 183-1 counts a period from the start of counting until a value of the comparison result changes, and outputs the count value as digital data of the pixel signal to the horizontal transfer unit 124B when the value of the comparison result changes.

The column A/D conversion unit 123A also has a configuration similar to that of the column A/D conversion unit 123B, and performs similar processing. That is, even in a case where any number of the column A/D conversion units 123 are included, each column A/D conversion unit 123 has a configuration similar to that in the example of FIG. 6, and performs similar processing.

Note that, the number of A/D conversion units of the column A/D conversion unit 123 is arbitrary, and there may be one system, or may be three or more systems. Regardless of the number of systems, the D/A conversion unit 113 can supply ramp signals independent of each other for respective systems. That is, for example, in a case where the column A/D conversion unit 123 includes M systems of A/D conversion units, the D/A conversion unit 113 can be provided with M independent D/A conversion units.

Figure 7:
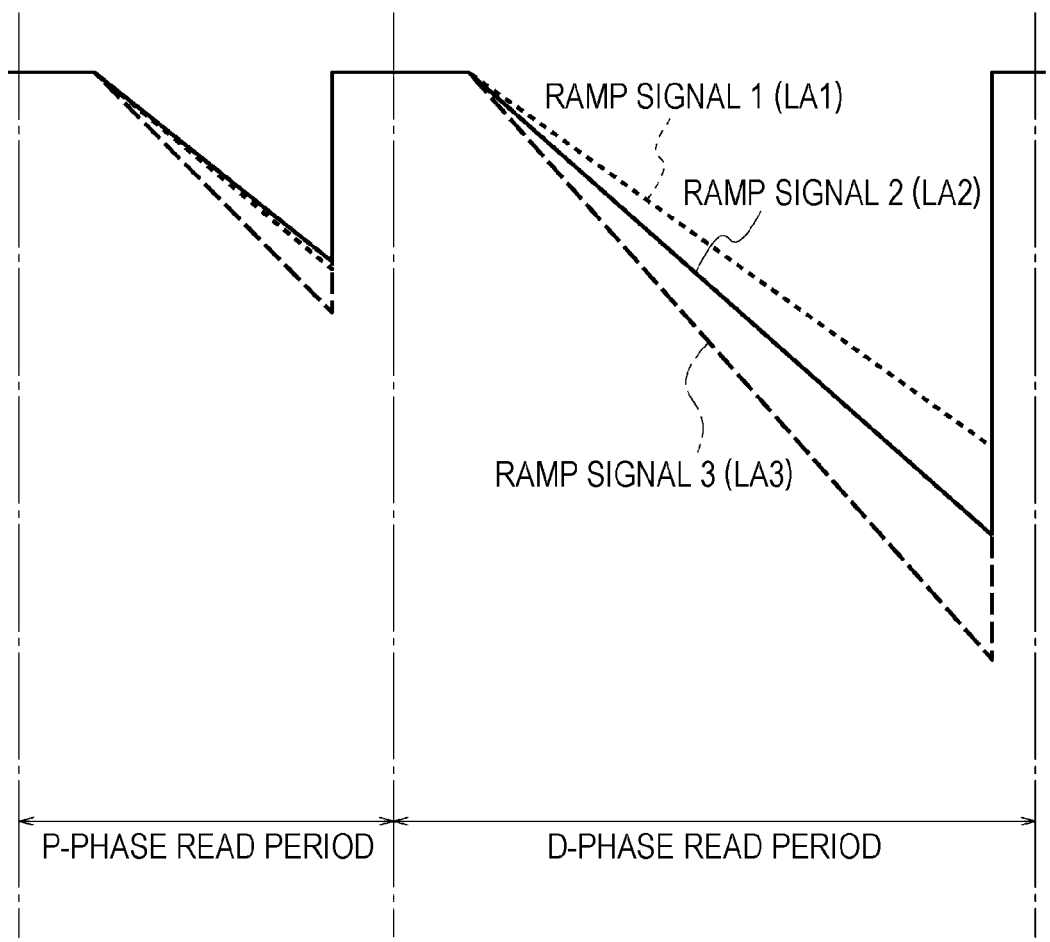
FIG. 7 is a diagram illustrating an example of a ramp signal output by the D/A conversion unit.

FIG. 7 illustrates an example of the ramp signal output by the D/A conversion unit 113. The D/A conversion unit 113 generates and outputs a ramp signal in accordance with control of the control unit 131. Here, the slope of the ramp signal can set a gain of the ramp signal of the A/D conversion unit of the column A/D conversion unit 123. For example, in a case where the slope of the ramp signal is small, the gain of the A/D conversion unit of the column A/D conversion unit 123 can be set to become large. On the other hand, in a case where the slope of the ramp signal is large, the gain of the A/D conversion unit of the column A/D conversion unit 123 can be set to become small. Furthermore, the D/A conversion unit 113 outputs the ramp signal twice for one reading of the pixel signal. In output of the first ramp signal, the reset level (P phase) of the unit pixel 151 is read (this period is referred to as a P-phase read period), and a pixel signal of the unit pixel 151 of the P phase is subjected to A/D conversion by the column A/D conversion unit 123. In output of the second ramp signal, a signal (D phase) photoelectrically converted by the unit pixel 151 is read (this period is referred to as a D-phase read period), and a pixel signal of the unit pixel 151 of the D phase is subjected to A/D conversion by the column A/D conversion unit 123. Furthermore, the slope of the ramp signal during the P-phase read period and the slope of the ramp signal during the D-phase read period are the same as each other. Note that, unless otherwise specified, "up" means the upward direction in FIG. 7, and "down" means the downward direction in FIG. 7.

FIG. 7 illustrates that, for example, a ramp signal 1, a ramp signal 2, and a ramp signal 3 have respective different slopes. As for the slope of the ramp signal, the D-phase read period can be shortened if the slope is made steep, whereas the D-phase read period can be lengthened if the slope is made gentle.

Thus, for example, a slope LA1 of the ramp signal 1 is a smaller slope than a slope LA2 of the ramp signal 2 and a slope LA3 of the ramp signal 3, so that the D-phase read period becomes longer. For this reason, the ramp signal 1 can set the gain of the A/D conversion unit of the column A/D conversion unit 123 so that the gain becomes larger than those by the ramp signal 2 and the ramp signal 3. On the other hand, the slope LA2 of the ramp signal 2 is a larger slope than the slope LA1 of the ramp signal 1 and is smaller than the slope LA3 of the ramp signal 3, so that the D-phase read period is a period between the ramp signal 1 and the ramp signal 3. For this reason, the ramp signal 2 can set the gain of the A/D conversion unit of the column A/D conversion unit 123 so that the gain becomes larger than that by the ramp signal 3 and smaller than that by the ramp signal 1. On the other hand, the slope LA3 of the ramp signal 3 is a larger slope than the slope LA1 of the ramp signal 1 and the slope LA2 of the ramp signal 2, so that the D-phase read period becomes shorter. For this reason, the ramp signal 3 can set the gain of the A/D conversion unit of the column A/D conversion unit 123 so that the gain becomes smaller than those by the ramp signal 1 and the ramp signal 2.

Note that, in the D/A conversion unit 113, the slopes of the ramp signals (slope LA1, slope LA2, slope LA3) are not limited to three, and a predetermined ramp signal slope can be set for each of the D/A conversion unit 113A and the D/A conversion unit 113B. As a result, in the D/A conversion unit 113, the gain can be set for each system.

Figure 8:
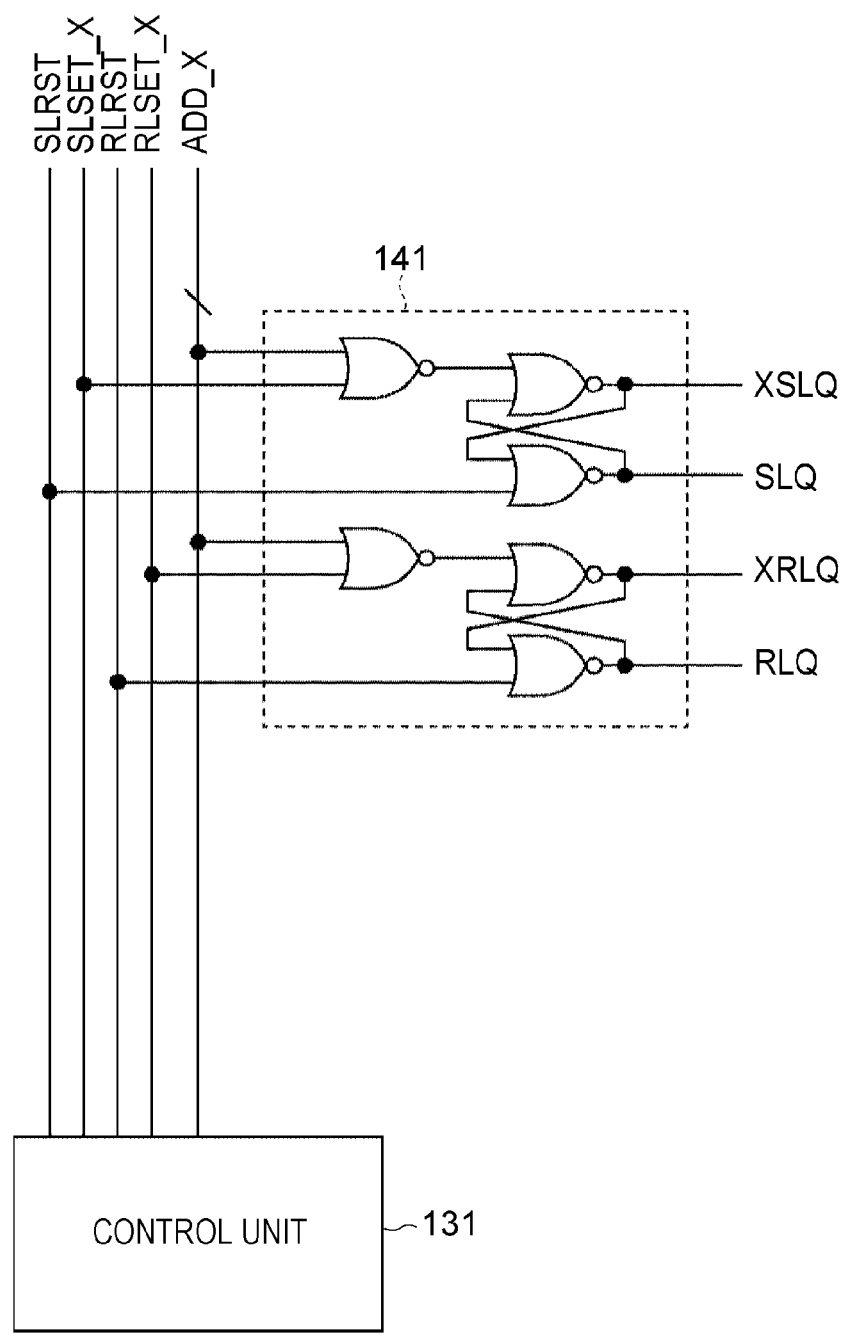
FIG. 8 is a diagram illustrating a main configuration example of an address decoder.

FIG. 8 illustrates a main configuration of the address decoder 141. The address decoder 141 includes a logic circuit for each line of the pixel array. Then, to the address decoder 141, control signals that designate addresses, such as an address for selecting pixels (ADD_X), a read latch reset (RLRST), a read latch set (RLSET_X), an electronic shutter latch reset (SLRST), and an electronic shutter latch set (SLSET_X), are input from the sensor controller 131. The address decoder 141 outputs to the pixel drive unit 142 a value "H (high)" as a read latch (RLQ) or an electronic shutter latch (SLQ) on the basis of these input signals, in the logic circuit of the line designated by the control unit 131. A NOT_read latch (XRLQ) and a NOT_electronic shutter latch (XSLQ) are pulses in which those control signals are in negative logic.

Figure 9:
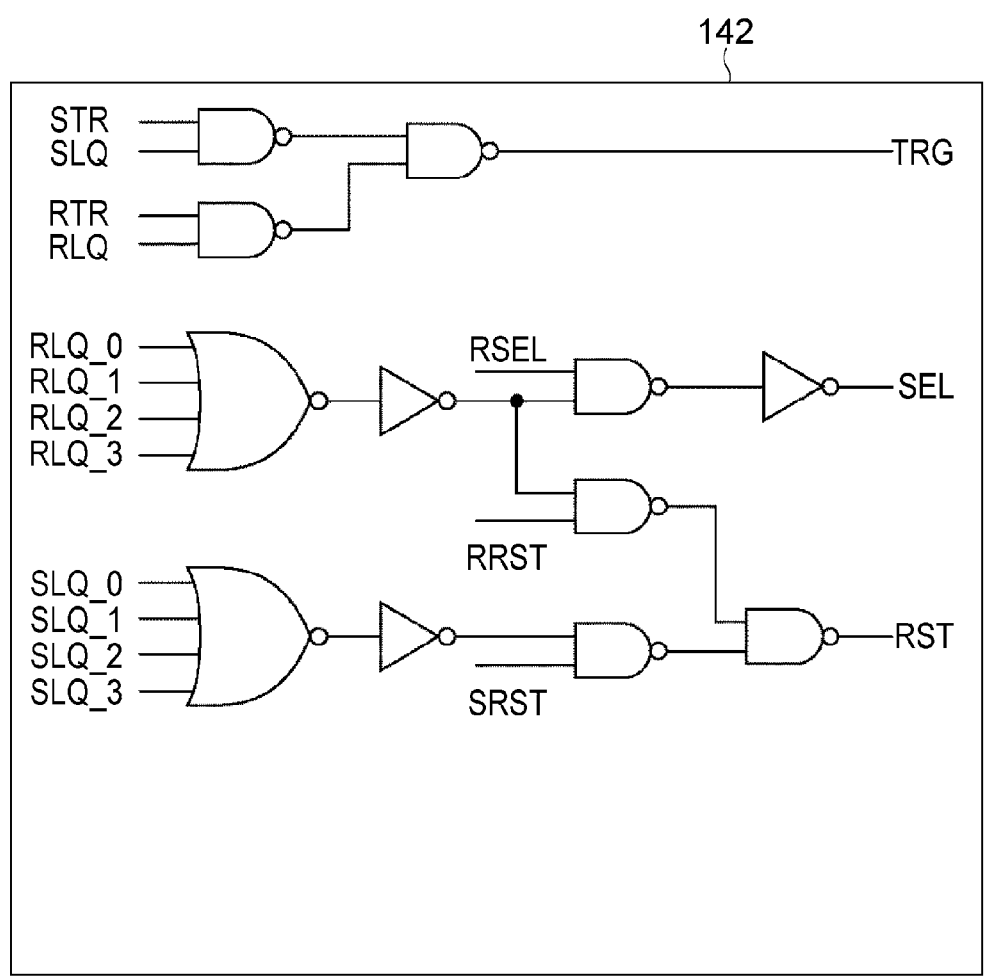
FIG. 9 is a diagram illustrating a main configuration example of a pixel drive unit.

FIG. 9 illustrates a main configuration example of the pixel drive unit 142. The pixel drive unit 142 includes a logic circuit for each unit pixel of the pixel array.

The pixel drive unit 142 supplies the control signal TRG, the control signal SEL, and the control signal RST to each transistor of each unit pixel 151 of the line in accordance with values of various control signals such as the read latch output pulse RLQ and the electronic shutter latch SLQ that are supplied from the address decoder 141, and a read transfer pulse RTR, an electronic shutter transfer pulse STR, an electronic shutter reset pulse SRST, a read reset pulse RRST, and a read selection pulse RSEL that are supplied from the sensor controller 131.

[Method for Wiring Solid-State Imaging Device of First Embodiment]

Next, a description will be given of a method for wiring the vertical signal line in the solid-state imaging device of the first embodiment according to the present technology.

The solid-state imaging device of the first embodiment according to the present technology is a solid-state imaging device including: at least two column areas that performs AD conversion of a pixel signal generated by a pixel; a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

Figure 10:
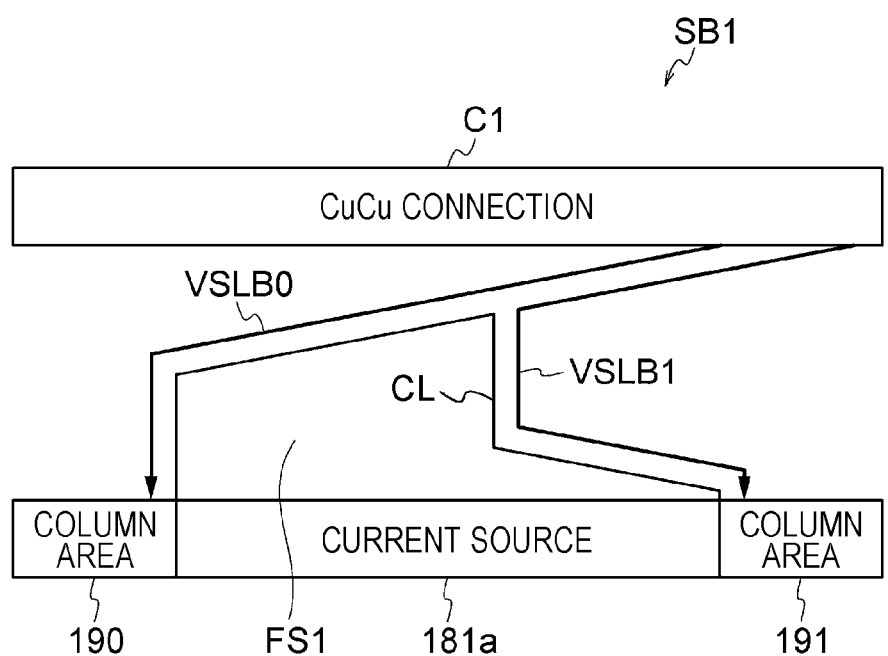
FIG. 10 is an explanatory diagram illustrating a method for wiring vertical signal lines in a solid-state imaging device of a first embodiment to which the present technology is applied.

FIG. 10 illustrates a method for wiring vertical signal lines in the solid-state imaging device of the first embodiment to which the present technology is applied. FIG. 10 is an explanatory diagram illustrating the method for wiring the vertical signal lines in the solid-state imaging device of the first embodiment to which the present technology is applied. Note that, the same members are designated by the same reference numerals, and the description thereof will be omitted as appropriate.

As illustrated in FIG. 10, a semiconductor substrate SB1 includes a CuCu connection C1, the column area 190, the current source 181a, the column area 191, and the free area FS1. The column area 190 and the column area 191 perform AD conversion of the pixel signal generated by the pixel.

Each of the vertical signal line VSLB0 and the vertical signal line VSLB1 is a signal line for transferring the pixel signal to the column area 190 or the column area 191. For example, the vertical signal line VSLB0 is a signal line for transferring the pixel signal of the CuCu connection C1 to the column area 190. The vertical signal line VSLB1 is a signal line for transferring the pixel signal of the CuCu connection C1 to the column area 191.

Note that, it is illustrated that each of the vertical signal line VSLB0 and the vertical signal line VSLB1 is wired to the column area 190 or the column area 191. For that reason, in the first embodiment, each of the vertical signal line VSLB0 and the vertical signal line VSLB1 includes the wiring length of a vertical signal line from a column pixel 121B to the selection unit 122B, that is, the vertical signal line VSL0, the vertical signal line VSL1, the vertical signal line VSL2, and the vertical signal line VSL3 (see FIGS. 1 and 2).

The free area FS1 is an area in which the plurality of vertical signal lines is not wired. Furthermore, the two vertical signal lines (vertical signal line VSLB0, vertical signal line VSLB1) facing each other sandwiching the free area FS1 are arranged, and the lengths of the two vertical signal lines (vertical signal line VSLB0, vertical signal line VSLB1) are substantially equal to each other. For example, the vertical signal line VSLB0 is connected from the CuCu connection C1 to the column area 190 via the free area FS1. Furthermore, the vertical signal line VSLB1 is wired in parallel from the CuCu connection C1 along an extension line of a substantial center line CL of the current source 181a, and bent, and connected to the column area 191.

As a result, the wiring length of the vertical signal line VSLB1 and the wiring length of the vertical signal line VSLB0 are substantially equal to each other.

Note that, the fact that the wiring lengths are substantially equal to each other means that, for example, an average is taken of the wiring lengths of the plurality of vertical signal lines, and the wiring length of the bent vertical signal line is within 10% of the average wiring length. Furthermore, the substantial center line CL of the current source 181a means a substantial center line in the width to the left and right of the current source 181a, and can be set to be, for example, a line within 1 [nm] in the left-right direction from the center line CL of the current source 181a including the center line of the current source 181a.

Furthermore, out of the two vertical signal lines (the vertical signal line VSLB0 and the vertical signal line VSLB1), one (vertical signal line VSLB1) of the vertical signal lines is wired in parallel along the substantial center line CL of the current source 181a forming the free area, and bent, and a resistance value of the one vertical signal line (vertical signal line VSLB1) and a resistance value of the other vertical signal line (vertical signal line VSLB1) are substantially equivalent to each other.

Note that, the fact that the resistance values are substantially equivalent to each other means that, for example, an average is taken of resistance values of a plurality of vertical signal lines, and the resistance value of the bent vertical signal line is within 10% of the average resistance value.

Furthermore, the semiconductor substrate SB1 is provided with the current source 181a between two column areas (the column area 190 and the column area 191). The current source 181a supplies a current as a power source to the column area 190 and the column area 191. Furthermore, the current source 181a includes, for example, a load Metal Oxide Semiconductor (MOS) transistor.

Figure 11:
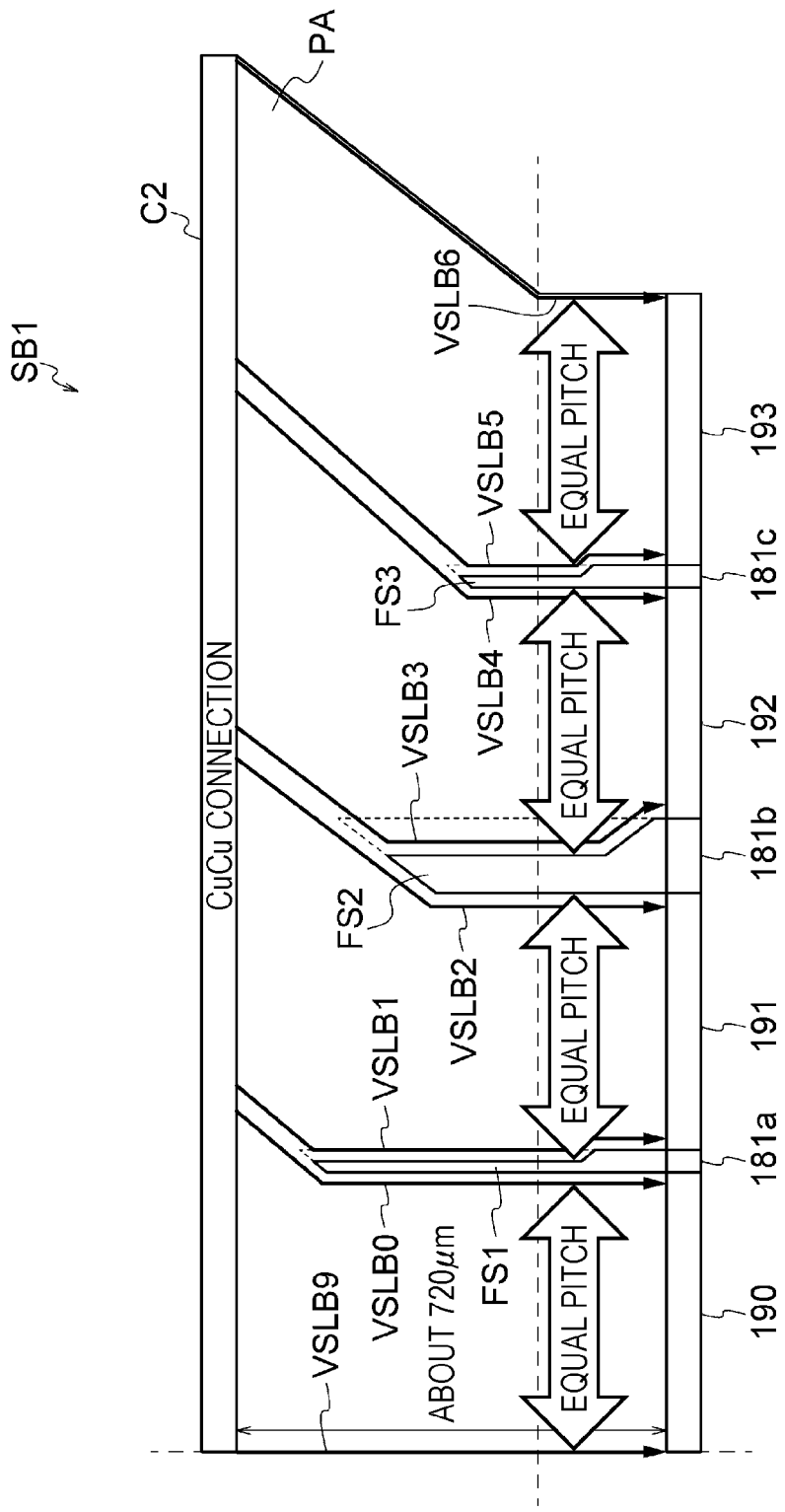
FIG. 11 is a plan view of a semiconductor substrate of the first embodiment to which the present technology is applied.

FIG. 11 illustrates a plan view of the semiconductor substrate of the first embodiment to which the present technology is applied. FIG. 11 is the plan view of the semiconductor substrate of the first embodiment to which the present technology is applied. Note that, the same members as the members described above are designated by the same reference numerals, and the description thereof will be omitted as appropriate.

As illustrated in FIG. 11, the semiconductor substrate SB1 includes a CuCu connection C2, the pitch area PA, the column area 190, the current source 181a, the column area 191, the current source 181b, the column area 192, the current source 181c, the column area 193, the free area FS1, the free area FS2, and the free area FS3.

For example, out of the two vertical signal lines VSLB0 and VSLB1, one (vertical signal line VSLB1) of the vertical signal lines is wired in parallel along the substantial center line of the current source 181a forming the free area FS1, and bent, and a resistance value of the one vertical signal line (vertical signal line VSLB1) and a resistance value of the other vertical signal line (vertical signal line VSLB0) are substantially equivalent to each other. In this case, the resistance value of the vertical signal line VSLB0 is 6.12 [kΩ], and the resistance value of the vertical signal line VSLB1 is 5.76 [kΩ].

Furthermore, for example, out of the two vertical signal lines VSLB2 and VSLB3, one (vertical signal line VSLB3) of the vertical signal lines is wired in parallel along the substantial center line of the current source 181b forming the free area FS2, and bent, and a resistance value of the one vertical signal line (vertical signal line VSLB3) and a resistance value of the other vertical signal line (vertical signal line VSLB2) are substantially equivalent to each other. In this case, the resistance value of the vertical signal line VSLB2 is 8.45 [kΩ], and the resistance value of the vertical signal line VSLB3 is 7.62 [kΩ].

Furthermore, for example, out of the two vertical signal lines VSLB4 and VSLB5, one (vertical signal line VSLB5) of the vertical signal lines is wired in parallel along the substantial center line of the current source 181c forming the free area FS3, and bent, and a resistance value of the one vertical signal line (vertical signal line VSLB5) and a resistance value of the other vertical signal line (vertical signal line VSLB4) are substantially equivalent to each other. In this case, the resistance value of the vertical signal line VSLB4 is 6.98 [kΩ], and the resistance value of the vertical signal line VSLB5 is 6.98 [kΩ].

As described above, one of the two vertical signal lines is wired in parallel along the substantial center line of the current source 181 forming the free area FS, and bent, and the wiring lengths of the two vertical signal lines are substantially equal to each other, whereby it is possible to bring the resistance values of the two vertical signal lines close to be substantially equivalent to each other.

Furthermore, in the first embodiment according to the present technology, a plurality of the two vertical signal lines is included, a plurality of the vertical signal lines different from the two vertical signal lines is wired between the one vertical signal line and the other vertical signal line, and intervals from the one vertical signal line to the other vertical signal line sandwiching the wired plurality of vertical signal lines can be made substantially equal intervals (equal pitches), respectively.

As a result, a change of the resistance values of the vertical signal lines can be made linear, and the unevenness of the P-phase distribution image can be made inconspicuous.

Figure 12:
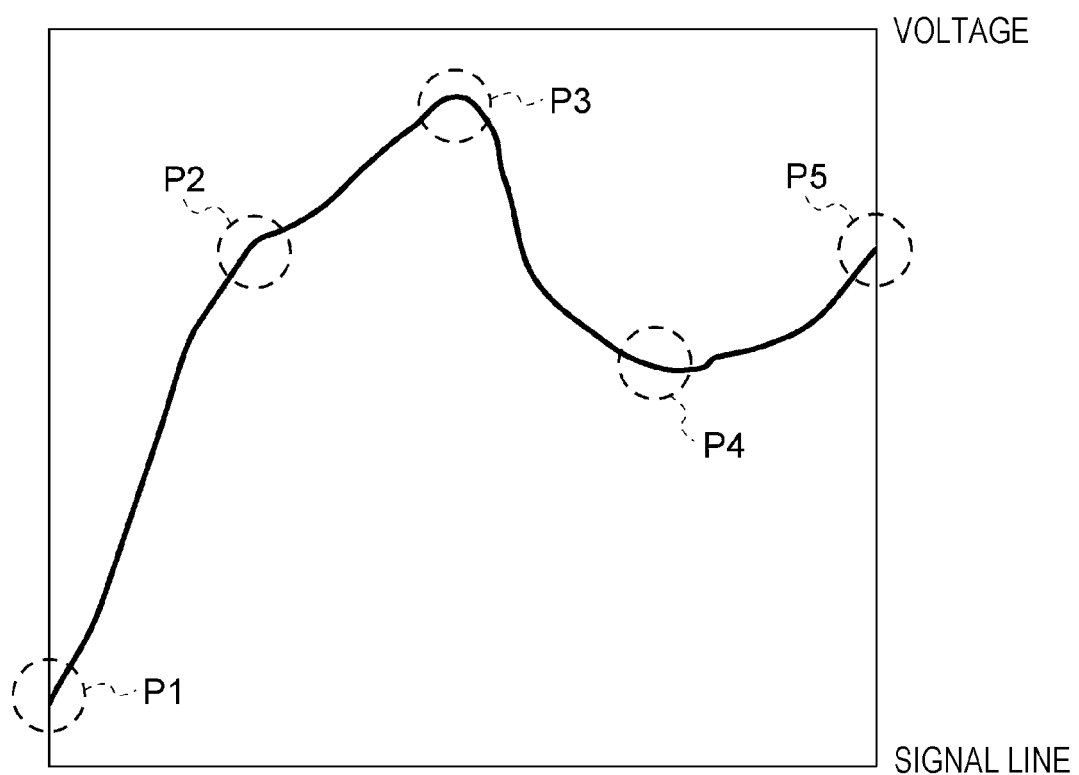
FIG. 12 is an explanatory diagram illustrating voltages corresponding to the vertical signal lines.

FIG. 12 illustrates voltages corresponding to the vertical signal lines illustrated in FIG. 11. FIG. 12 is an explanatory diagram illustrating the voltages corresponding to the vertical signal lines illustrated in FIGS. 19A and 19B. Note that, the horizontal axis of FIG. 12 corresponds to the horizontal axis in which the column area 190, the column area 191, the column area 192, and the column area 193 of FIG. 11 are arranged.

In FIG. 12, the voltage of each vertical signal line is indicated, an area where the voltage is high indicates that the resistance value is high, and an area where there is a difference in voltage indicates that the difference in resistance value is large. On the other hand, an area where there is no difference in voltage indicates that there is no difference in resistance value and the change is linear.

For example, an area P1 in FIG. 12 corresponds to a vertical signal line VSLB9 in the column area 190 in FIG. 11. The voltage of the vertical signal line VSLB9 is lower than an average voltage in FIG. 12. Furthermore, an area P2 in FIG. 12 corresponds to the vertical signal line VSLB0 and the vertical signal line VSLB1 in FIG. 11. In the area P2, since the wiring lengths of the respective vertical signal lines VSLB0 and VSLB1 are substantially equal to each other, the resistance values of the respective vertical signal lines VSLB0 and VSLB1 are also substantially equivalent to each other, and voltage values of the respective vertical signal lines VSLB0 and VSLB1 are also substantially equivalent to each other.

An area P3 in FIG. 12 corresponds to the vertical signal line VSLB2 and the vertical signal line VSLB3 in FIG. 11. In the area P3, since the wiring lengths of the respective vertical signal lines VSLB2 and VSLB3 are substantially equal to each other, the resistance values of the respective vertical signal lines VSLB2 and VSLB3 are also substantially equivalent to each other, and voltage values of the respective vertical signal lines VSLB2 and VSLB3 are also substantially equivalent to each other.

An area P4 in FIG. 12 corresponds to the vertical signal lines VSLB4 and the vertical signal line VSLB5 in FIG. 11. In the area P4, since the wiring lengths of the respective vertical signal lines VSLB4 and VSLB5 are substantially equal to each other, the resistance values of the respective vertical signal lines VSLB4 and VSLB5 are also substantially equivalent to each other, and voltage values of the respective vertical signal lines VSLB4 and VSLB5 are also substantially equivalent to each other. An area P5 in FIG. 12 corresponds to a vertical signal line VSLB6 in FIG. 11. The voltage of the vertical signal line VSLB6 is higher than the average voltage in FIG. 12.

As described above, FIG. 12 illustrates that the wiring lengths of the two vertical signal lines are substantially equal to each other, and the resistance values of the two vertical signal lines are substantially equivalent to each other. Furthermore, in the first embodiment according to the present technology, a plurality of the vertical signal lines different from the two vertical signal lines is wired between one vertical signal line and the other vertical signal line, a plurality of the two vertical signal lines is included, and intervals from the one vertical signal line to the other vertical signal line are made substantially equal intervals (equal pitches), respectively, whereby the change of the resistance values of the vertical signal lines can be made linear.

Figure 13:
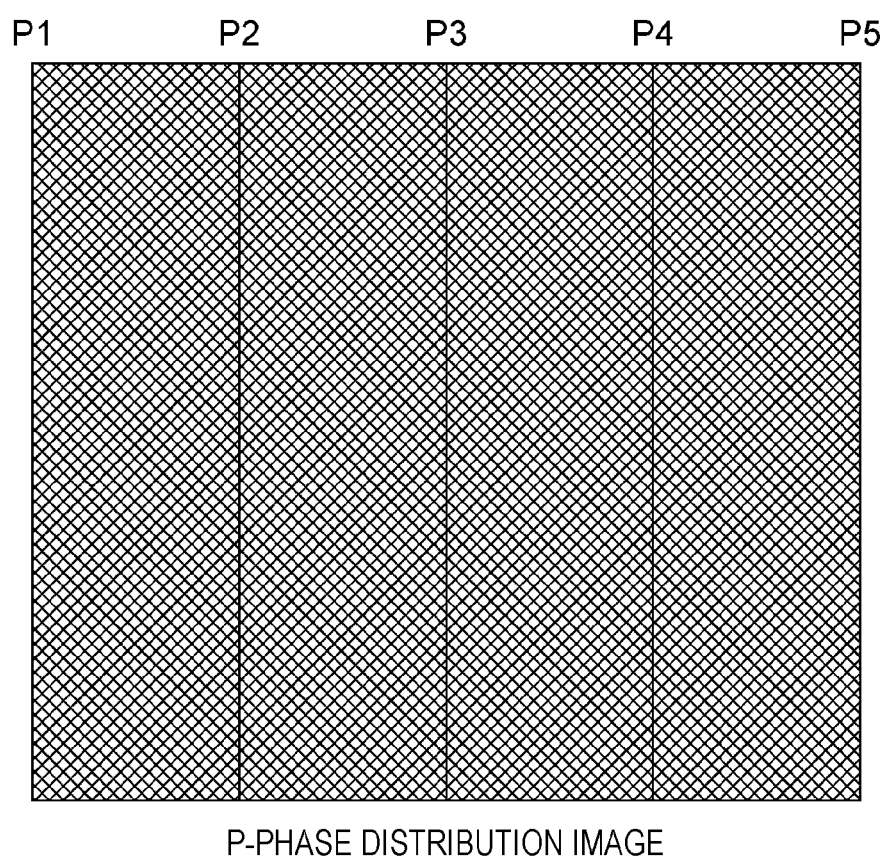
FIG. 13 is an explanatory diagram illustrating a P-phase distribution image in a state where vertical signal lines to which the present technology is applied are wired.

FIG. 13 illustrates a P-phase distribution image in a state where the vertical signal lines to which the present technology is applied are wired. FIG. 13 is an explanatory diagram illustrating the P-phase distribution image in the state where the vertical signal lines to which the present technology is applied are wired. Note that, the same members as the members illustrated in FIG. 12 are designated by the same reference numerals, and the description thereof will be omitted as appropriate.

FIG. 13 illustrates a P-phase distribution image in which P-phase pixel signals are read in the areas P1 to P5. In the P-phase distribution image of FIG. 13, since there is almost no difference in the resistance values of the vertical signal lines, the step of the voltage that has appeared in the areas Q2, Q3, and Q4 is eliminated. Furthermore, intervals from one vertical signal line to the other vertical signal line are made substantially equal intervals (equal pitches), respectively, whereby the change of the resistance values of the vertical signal lines can be made linear, and as a result, it is possible to eliminate the unevenness of the P-phase distribution image on one surface from the area P1 to the area P5.

As described above, the solid-state imaging device of the first embodiment according to the present technology includes: at least two column areas that performs AD conversion of a pixel signal generated by a pixel; a plurality of vertical signal lines that transfers the pixel signal to the column areas; and a free area in which the plurality of vertical signal lines is not wired. Furthermore, in the solid-state imaging device of the first embodiment according to the present technology, two of the vertical signal lines facing each other sandwiching the free area are arranged, and lengths of the two vertical signal lines are substantially equal to each other.

According to the solid-state imaging device of the first embodiment according to the present technology, resistance values of the vertical signal lines from the CuCu connection to the column areas are substantially equivalent to each other, so that image quality of a captured image can be improved.

3. Second Embodiment (Second Example of Solid-State Imaging Device)

A solid-state imaging device of a second embodiment according to the present technology is a solid-state imaging device in which, out of the two vertical signal lines in the solid-state imaging device of the first embodiment, one vertical signal line is connected to one of the two column areas, and the other vertical signal line is connected to the other column area arranged via a current source that supplies a power source to the two column areas, and the free area is an isosceles triangle, and each of the two vertical signal lines is arranged to be along a corresponding one of the two equal sides of the isosceles triangle.

In this case, the solid-state imaging device of the second embodiment according to the present technology further includes a plurality of current sources, in which each of the plurality of current sources is provided one each between two of the column areas, and the plurality of vertical signal lines is wired such that intervals between the adjacent plurality of vertical signal lines are equal intervals, respectively, toward at least one current source among the plurality of current sources. Furthermore, the free area may be an isosceles triangle, and each of the two vertical signal lines may be arranged to be along a corresponding one of the two equal sides of the isosceles triangle.

According to the solid-state imaging device of the second embodiment according to the present technology, the resistance values of the vertical signal lines from the CuCu connection to the column area are substantially equivalent to each other, similarly to the solid-state imaging device of the first embodiment, so that the image quality of the captured image can be improved.

Figure 14:
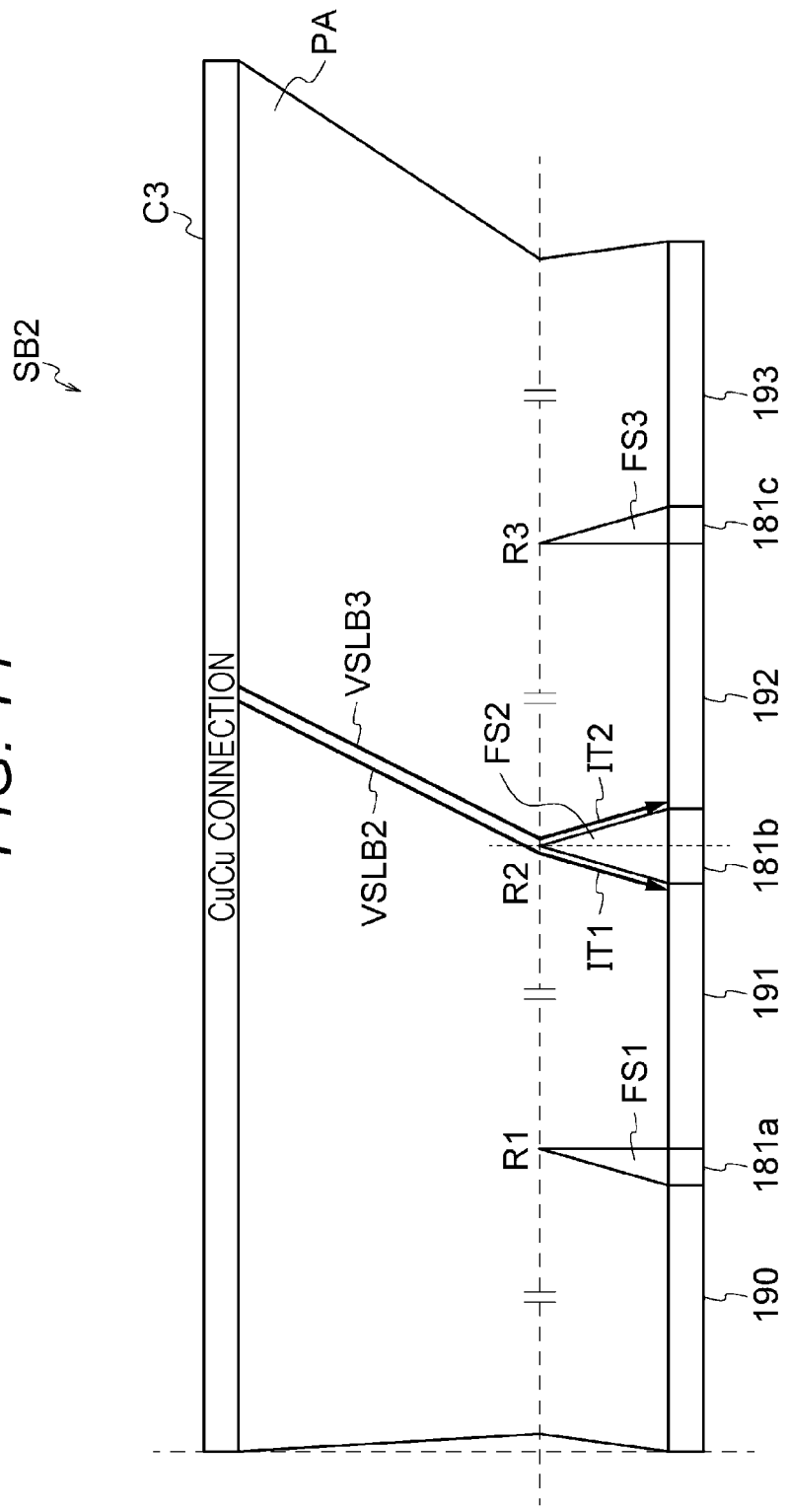
FIG. 14 is a plan view of a semiconductor substrate of a second embodiment to which the present technology is applied in a case where the number of current sources is an odd number.

FIG. 14 illustrates a plan view of a semiconductor substrate of the second embodiment to which the present technology is applied. FIG. 14 is the plan view of the semiconductor substrate of the second embodiment to which the present technology is applied. Note that, the same members as those of the semiconductor substrate SB1 of the first embodiment are designated by the same reference numerals, and the description thereof will be omitted as appropriate.

As illustrated in FIG. 14, a semiconductor substrate SB2 includes a CuCu connection C3, the pitch area PA, the column area 190, the current source 181a, the column area 191, the current source 181b, the column area 192, the current source 181c, the column area 193, the free area FS1, the free area FS2, and the free area FS3. Note that, a plurality of vertical signal lines is arranged in the pitch conversion area PA.

In the semiconductor substrate SB2 of the second embodiment according to the present technology, in a case where there is a plurality of (for example, three) current sources 181 (current source 181a, current source 181b, current source 181c), each of the plurality of current sources is provided one each between two column areas (column area 190 and column area 191, column area 191 and column area 192, column area 192 and column area 193). Furthermore, a plurality of vertical signal lines is wired so that intervals between the adjacent plurality of vertical signal lines are equal intervals, respectively, toward at least one current source (current source 181a, current source 181b, current source 181c) among the plurality of current sources (current source 181a, current source 181b, current source 181c), and the free area FS2 is an isosceles triangle, and each of the two vertical signal lines VSLB2 and VSLB3 is arranged to be along a corresponding one of the two equal sides of the isosceles triangles.

For example, the plurality of vertical signal lines is wired so that intervals between the adjacent plurality of vertical signal lines are equal intervals, respectively, toward the current source 181b. Then, each of the plurality of vertical signal lines is distributed by distribution points (point R1, point R2, point R3) and connected to the column area (column area 190, column area 191, column area 192, column area 193). Note that, the distribution points (point R1, point R2, point R3) are passing points for performing distribution so that intervals between the adjacent plurality of vertical signal lines are equal intervals, respectively.

For example, the semiconductor substrate SB2 can divide the pitch conversion area PA into four groups. In the example of FIG. 14, the pitch conversion area PA is divided into four in the longitudinal direction (horizontal axis) on the basis of the points R1, R2, and R3. For example, in a case where division is performed into four areas along the longitudinal direction (horizontal axis) of the CuCu connection C3, an area located on the leftmost side of the CuCu connection C3 is connected to the column area 190 via the left side of the point R1. Furthermore, the second area from the left side of the CuCu connection C3 is connected to the column area 191 via an area between the points R1 and R2. Furthermore, the third area from the left side of the CuCu connection C3 is connected to the column area 192 via an area between the points R2 and R3. Furthermore, an area in the rightmost side of the CuCu connection C3 is connected to the column area 193 via an area on the right side of the point R3.

Here, the vertical signal line VSLB2 that is a part of the plurality of vertical signal lines is connected to the column area 191 via the left side of the point R2. Furthermore, the vertical signal line VSLB3 that is a part of the plurality of vertical signal lines is connected to the column area 192 via the right side of the point R2. In this case, the vertical signal line VSLB2 is connected to the column area 191 by a signal line IT1 of the vertical signal line VSLB2 via the left side of the point R2. Furthermore, the vertical signal line VSLB3 is connected to the column area 192 by a signal line IT2 of the vertical signal line VSLB3 via the right side of the point R2.

As a result, out of the two vertical signal lines, one vertical signal line VSLB2 is connected to one column area 191 of the two column areas (column area 191, column area 192), and the other vertical signal line VSLB3 is connected to the other column area 192 arranged via the current source 181b that supplies a power source to the two column areas (column area 191, column area 192). Furthermore, the free area FS2 is an isosceles triangle, and each of the two vertical signal lines (vertical signal line VSLB2 (signal line IT1), vertical signal line VSLB3 (signal line IT2)) is arranged to be along a corresponding one of the two equal sides of the isosceles triangle.

Here, since the signal line IT1 and the signal line IT2 are arranged to be along the equal sides of the free area FS2 that is an isosceles triangle, the wiring lengths of the signal line IT1 and the signal line IT2 are substantially equal to each other. Furthermore, since the wiring length to the point R of the vertical signal line VSLB2 and the wiring length to the point R of the vertical signal line VSLB3 are substantially equal to each other, the wiring length of the vertical signal line VSLB2 including the signal line IT1 and the wiring length of the vertical signal line VSLB3 including the signal line IT2 are also substantially equal to each other, and a resistance value of the vertical signal line VSLB2 including the signal line IT1 and a resistance value of the vertical signal line VSLB3 including the signal line IT2 are also substantially equivalent to each other. Note that, the wiring length of the vertical signal line VSLB2 also includes the wiring length of the signal line IT1, and the wiring length of the vertical signal line VSLB3 also includes the wiring length of the signal line IT2.

Similarly, distribution of each of other plurality of vertical signal lines is performed at any of the points R1, R2, and R3, and each of other two vertical signal lines is connected to any of the column area 190, the column area 191, the column area 192, and the column area 193 via the left and right of the point R1 or the point R3.

Furthermore, also in a case where the number of current sources is an even number, each of the plurality of current sources is provided one each between the two column areas, and wiring is performed so that intervals between the adjacent plurality of vertical signal lines are equal intervals, respectively, toward at least one current source among the plurality of current sources.

Figure 15:
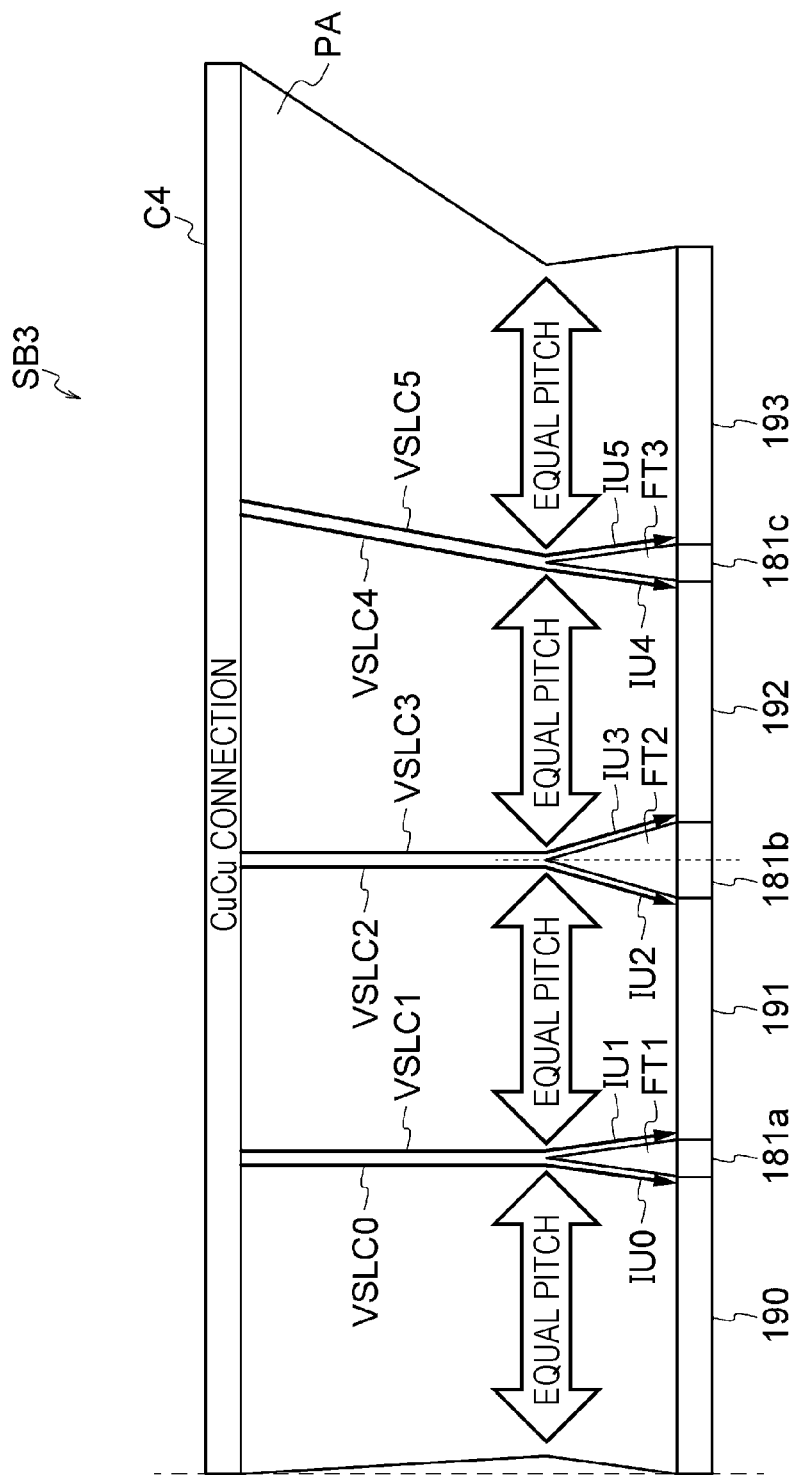
FIG. 15 is a plan view of the semiconductor substrate of the second embodiment to which the present technology is applied in a case where the number of current sources is an even number.

FIG. 15 illustrates a plan view of the semiconductor substrate of the second embodiment to which the present technology is applied in a case where the number of current sources is an even number. FIG. 15 is the plan view of the semiconductor substrate of the second embodiment to which the present technology is applied in the case where the number of current sources is an even number. Note that, the same members as those of the semiconductor substrate SB2 of the second embodiment are designated by the same reference numerals, and the description thereof will be omitted as appropriate.

As illustrated in FIG. 15, the semiconductor substrate SB3 includes a CuCu connection C4, the pitch area PA, the column area 190, the current source 181a, the column area 191, the current source 181b, the column area 192, the current source 181c, the column area 193, a free area FT1, a free area FT2, and a free area FT3.

In the semiconductor substrate SB3 of the second embodiment according to the present technology, a part is illustrated of a case where there are an even number of current sources, and each of the plurality of current sources is provided one each between the two column areas. Furthermore, in FIG. 15, a plurality of vertical signal lines is wired so that intervals between adjacent sets of two vertical signal lines are equal intervals (equal pitch), respectively, toward the three current sources 181a, 181b, and 181c among the even number of current sources. Furthermore, the free area FT1, the free area FT2, and the free area FT3 are isosceles triangles, and each of the two vertical signal lines is arranged to be along a corresponding one of the two equal sides of the isosceles triangle in the free area (free area FT1, free area FT2, free area FT3).

Here, since a signal line IU0 and a signal line IU1 are arranged to be along the equal sides of the free area FT1 that is an isosceles triangle, the wiring lengths of the signal line IU0 and the signal line IU1 are substantially equal to each other. Furthermore, since the wiring lengths wired side by side are substantially equal lengths, the wiring length of the vertical signal line VSLC0 and the wiring length of the vertical signal line VSLC1 are also substantially equal to each other. For that reason, the wiring length of the vertical signal line VSLC0 including the signal line IU0 and the wiring length of the vertical signal line VSLC1 including the signal line IU1 are also substantially equal to each other, and a resistance value of the vertical signal line VSLC0 including the signal line IU0 and a resistance value of the vertical signal line VSLC1 including the signal line IU1 are also substantially equivalent to each other.

Furthermore, since a signal line IU2 and a signal line IU3 are arranged to be along the equal sides of the free area FT2 that is an isosceles triangle, the wiring lengths of the signal line IU2 and the signal line IU3 are substantially equal to each other. Furthermore, since the wiring lengths wired side by side are substantially equal lengths, the wiring length of the vertical signal line VSLC2 and the wiring length of the vertical signal line VSLC3 are also substantially equal to each other. For that reason, the wiring length of the vertical signal line VSLC2 including the signal line IU2 and the wiring length of the vertical signal line VSLC3 including the signal line IU3 are substantially equal to each other, and a resistance value of the vertical signal line VSLC2 including the signal line IU2 and a resistance value of the vertical signal line VSLC3 including the signal line IU3 are also substantially equivalent to each other.

Furthermore, since a signal line IU4 and a signal line IU5 are arranged along the equal sides of the free area FT3 that is an isosceles triangle, the wiring lengths of the signal line IU4 and the signal line IU5 are substantially equal to each other. Furthermore, since the wiring lengths wired side by side are substantially equal lengths, the wiring length of the vertical signal line VSLC4 and the wiring length of the vertical signal line VSLC5 are also substantially equal to each other. For that reason, the wiring length of the vertical signal line VSLC4 including the signal line IU4 and the wiring length of the vertical signal line VSLC5 including the signal line IU5 are also substantially equal to each other, and a resistance value of the vertical signal line VSLC4 including the signal line IU4 and a resistance value of the vertical signal line VSLC5 including the signal line IU5 are also substantially equivalent to each other.

As described above, in the solid-state imaging device of the second embodiment according to the present technology, the resistance values of the vertical signal lines from the CuCu connection C3 to the column areas are substantially equivalent to each other, so that the image quality of the captured image can be improved.

4. Third Embodiment Relating to Electronic Device

An electronic device of a third embodiment according to the present technology is an electronic device including a solid-state imaging device including: at least two column areas that performs Analog To Digital (AD) conversion of a pixel signal produced by a pixel; a plurality of vertical signal lines that transfers the pixel signal to the column areas; and a free area in which the plurality of vertical signal lines is not wired, in which lengths of two vertical signal lines facing each other sandwiching the free area among the plurality of vertical signal lines are substantially equal to each other. Furthermore, the electronic device of the third embodiment according to the present technology may be an electronic device equipped with a solid-state imaging device of any one of the first and second embodiments according to the present technology.

Figure 16:
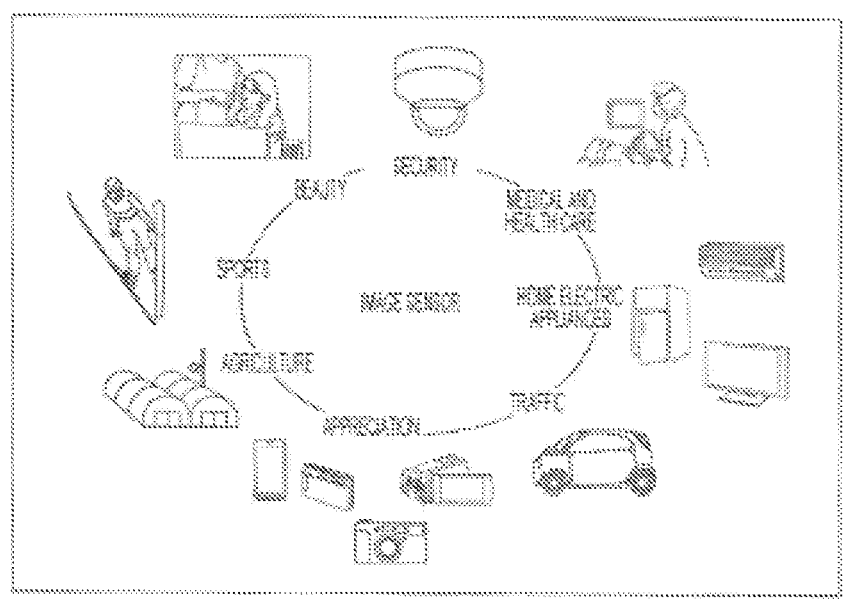
FIG. 16 is a diagram illustrating a usage example of the solid-state imaging devices of the first and second embodiments to which the present technology is applied.

5. Usage Examples of Solid-State Imaging Device to which the Present Technology is Applied FIG. 16 is a diagram illustrating a usage example of the solid-state imaging device of any one of the first and second embodiments according to the present technology as image sensors.

The solid-state imaging devices of the first and second embodiments described above can be used for various cases of sensing light such as visible light, infrared light, ultraviolet light, or X-rays, for example, as follows. That is, as illustrated in FIG. 16, the solid-state imaging device of any one of the first and second embodiments can be used for a device (for example, the electronic device of the third embodiment described above) used in, for example, a field of appreciation in which an image to be used for appreciation is imaged, a field of traffic, a field of home electric appliances, a field of medical and health care, a field of security, a field of beauty, a field of sports, a field of agriculture, or the like.

Specifically, in the field of appreciation, the solid-state imaging device of any one of the first and second embodiments can be used for devices for capturing an image to be used for appreciation, for example, a digital camera, a smartphone, a mobile phone with a camera function, and the like.

In the field of traffic, for example, for safe driving such as automatic stop, and recognition of driver's condition, the solid-state imaging device of any one of the first and second embodiments can be used for devices to be used for traffic, such as an automotive sensor for imaging ahead of, behind, around, inside the car, and the like, a monitoring camera for monitoring traveling vehicles and roads, and a distance measurement sensor for measuring a distance between vehicles and the like.

In the field of home electric appliances, for example, for imaging a user's gesture and performing device operation in accordance with the gesture, the solid-state imaging device of any one of the first and second embodiments can be used for devices to be used for home electric appliances, such as a television receiver, a refrigerator, and an air conditioner.

In the field of medical and health care, the solid-state imaging device of any one of the first and second embodiments can be used for devices to be used for medical and health care, for example, an endoscope, a device for performing angiography by receiving infrared light, and the like.

In the field of security, the solid-state imaging device of any one of the first and second embodiments can be used for devices to be used for security, for example, a monitoring camera for crime prevention, a camera for person authentication, and the like.

In the field of beauty, the solid-state imaging device of any one of the first and second embodiments can be used for devices to be used for beauty, for example, a skin measuring instrument for imaging skin, a microscope for imaging a scalp, and the like.

In the field of sports, the solid-state imaging device of any one of the first and second embodiments can be used for devices to be used for sports, for example, an action camera for sports application, a wearable camera, and the like.

In the field of agriculture, the solid-state imaging device of any one of the first and second embodiments can be used for devices to be used for agriculture, for example, a camera for monitoring conditions of fields and crops, and the like.

Next, a usage example will be specifically described of the solid-state imaging devices of the first and second embodiments according to the present technology. For example, the solid-state imaging device described above can be applied to all types of electronic devices having an imaging function, for example, a camera system such as a digital still camera or a video camera, a mobile phone having an imaging function, and the like. FIG. 17 illustrates a schematic configuration of an electronic device 102 (camera) as an example. The electronic device 102 is, for example, a video camera capable of imaging a still image or a moving image, and includes a solid-state imaging device 101, an optical system (optical lens) 310, a shutter device 311, a drive unit 313 that drives the solid-state imaging device 101 and the shutter device 311, and a signal processing unit 312.

The optical system 310 guides image light (incident light) from a subject to a pixel unit 101*a* of the solid-state imaging device 101. The optical system 310 may include a plurality of optical lenses. The shutter device 311 controls a light irradiation period and a light shielding period for the solid-state imaging device 101. The drive unit 313 controls transfer operation of the solid-state imaging device 101 and shutter operation of the shutter device 311. The signal processing unit 312 performs various types of signal processing on a signal output from the solid-state imaging device 101. A video signal Dout after the signal processing is stored in a storage medium such as a memory, or output to a monitor or the like.

Note that, the embodiment according to the present technology is not limited to the embodiments described above, and various modifications are possible without departing from the scope of the present technology.

Furthermore, the first to third embodiments according to the present technology are not limited to the embodiments described above, and various modifications are possible without departing from the scope of the present technology.

Furthermore, the advantageous effects described in the specification are merely examples, and the advantageous effects of the present technology are not limited to them and may include other effects.

Furthermore, the present technology can have a configuration as follows.

(1) A solid-state imaging device including:

at least two column areas that perform Analog To Digital (AD) conversion of a pixel signal generated by a pixel;

a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

(2) The solid-state imaging device according to (1), in which out of the two vertical signal lines, one of the vertical signal lines is wired in parallel along a substantial center line of a current source forming the free area, and bent, and a resistance value of the one vertical signal line and a resistance value of another of the vertical signal lines are substantially equivalent to each other.

(3) The solid-state imaging device according to (1) or (2), further including one current source that is provided between the two column areas and supplies a power source.

(4) The solid-state imaging device according to (3), in which the current source includes a load MOS transistor.

(5) The solid-state imaging device according to (2), in which a plurality of the two vertical signal lines is included, a plurality of the vertical signal lines different from the two vertical signal lines is wired between the one vertical signal line and the other vertical signal line, and intervals from the one vertical signal line to the other vertical signal line sandwiching the wired plurality of vertical signal lines are substantially equal intervals, respectively.

(6) The solid-state imaging device according to any one of (1) to (5), in which out of the two vertical signal lines, one of the vertical signal lines is connected to one of the two column areas, and another of the vertical signal lines is connected to another of the column areas arranged via a current source that supplies a power source to the two column areas, and the free area is an isosceles triangle, and each of the two vertical signal lines is arranged to be along a corresponding one of the two equal sides of the isosceles triangle.

(7) The solid-state imaging device according to any one of (1) to (6), further including a plurality of current sources, in which each of the plurality of current sources is provided one each between two of the column areas, the plurality of vertical signal lines is wired such that intervals between the adjacent plurality of vertical signal lines are equal intervals, respectively, toward at least one current source among the plurality of current sources, and the free area is an isosceles triangle, and each of the two vertical signal lines is arranged to be along a corresponding one of the two equal sides of the isosceles triangle.

(8) An electronic device including a solid-state imaging device, in which the solid-state imaging device includes: at least two column areas that perform Analog To Digital (AD) conversion of a pixel signal generated by a pixel;

a plurality of vertical signal lines that transfers the pixel signal to the column areas; and a free area in which the plurality of vertical signal lines is not wired, in which two of the vertical signal lines facing each other sandwiching the free area are arranged, and lengths of the two vertical signal lines are substantially equal to each other.

(9) A solid-state imaging device including:

at least two column areas that perform Analog To Digital (AD) conversion of a pixel signal generated by a pixel;

a plurality of vertical signal lines that transfers the pixel signal to the column areas; and a free area in which the plurality of vertical signal lines is not wired, in which among the plurality of vertical signal lines, two of the vertical signal lines facing each other sandwiching the free area are arranged, and lengths of the two vertical signal lines are substantially equal to each other.

(10) The solid-state imaging device according to (9), in which out of the two vertical signal lines, one of the vertical signal lines is wired in parallel along an extension line of a substantial center line of a current source located below the free area, and bent to have substantially equal length to another of the vertical signal lines, and a resistance value of the one vertical signal line and a resistance value of the other vertical signal line are substantially equivalent to each other.

(11) The solid-state imaging device according to (9) or (10), further including one current source that is provided between the two column areas and supplies a power source.

(12) The solid-state imaging device according to (11), in which the current source includes a load MOS transistor.

(13) The solid-state imaging device according to any one of (9) to (12) above, in which the two vertical signal lines are one set including a first vertical signal line and a second vertical signal line, and a plurality of the sets is included, each of a plurality of the first vertical signal lines constituting the plurality of sets is bent, the plurality of vertical signal lines includes the plurality of sets including the two vertical signal lines, and a wiring line group arranged in each of areas formed between the sets adjacent to each other, and intervals between the sets adjacent to each other are substantially equal intervals, respectively.

(14) The solid-state imaging device according to any one of (9) to (13), in which out of the two vertical signal lines, one of the vertical signal lines is connected to one of the two column areas, and another of the vertical signal lines is connected to another of the column areas arranged via a current source that supplies a power source to the two column areas, and the free area is an isosceles triangle, and each of the two vertical signal lines is arranged to be along a corresponding one of the two equal sides of the isosceles triangle.

(15) The solid-state imaging device according to any one of (9) to (14), further including a plurality of current sources, in which each of the plurality of current sources is provided one each between two of the column areas, the plurality of vertical signal lines is wired such that intervals between the adjacent plurality of vertical signal lines are equal intervals, respectively, toward at least one current source among the plurality of current sources, and the free area is an isosceles triangle, and each of the two vertical signal lines is arranged to be along a corresponding one of the two equal sides of the isosceles triangle.

(16) An electronic device including a solid-state imaging device, in which the solid-state imaging device includes: at least two column areas that perform Analog To Digital (AD) conversion of a pixel signal generated by a pixel;

a plurality of vertical signal lines that transfers the pixel signal to the column areas; and a free area in which the plurality of vertical signal lines is not wired, in which among the plurality of vertical signal lines, two of the vertical signal lines facing each other sandwiching the free area are arranged, and lengths of the two vertical signal lines are substantially equal to each other.

REFERENCE SIGNS LIST

100 Solid-state imaging device
181a, 181b, 181c Current source
190, 191, 192, 193 Column area
FS1, FS2, FS3 Free area
VSLB0, VSLB1, VSLB2, VSLB3, VSLB4 Vertical signal line
VSLB5, VSLB6, VSLB9 Vertical signal line
C1, C2, C3, C10 CuCu connection

The invention claimed is:

1. A solid-state imaging device, comprising:
a pixel array that includes a pixel configured to generate a pixel signal;
at least two column areas configured to selectively perform analog to digital conversion of the pixel signal;
a plurality of vertical signal lines configured to selectively transfer the pixel signal to the at least two column areas;
a free area in which the plurality of vertical signal lines is not wired; and
a current source configured to supply a power source to the at least two column areas, wherein
the current source is between two column areas of the at least two column areas,
two vertical signal lines of the plurality of vertical signal lines face each other,
the two vertical signal lines of the plurality of vertical signal lines sandwich the free area, and
lengths of the two vertical signal lines are substantially equal to each other.

2. The solid-state imaging device according to claim 1, wherein
out of the two vertical signal lines of the plurality of vertical signal lines, a first vertical signal line of the two vertical signal lines is wired in parallel along a substantial center line of the current source forming the free area, and bent, and
a resistance value of the first vertical signal line is equivalent to a resistance value of a second vertical signal line of the two vertical signal lines.

3. The solid-state imaging device according to claim 1, wherein the current source includes a load MOS transistor.

4. The solid-state imaging device according to claim 2, wherein
a plurality of the vertical signal lines different from the two vertical signal lines is wired between the first vertical signal line and the second vertical signal line,
intervals from the first vertical signal line to the second vertical signal line are substantially equal intervals, and
the intervals from the first vertical signal line to the second vertical signal line sandwich the plurality of vertical signal lines.

5. The solid-state imaging device according to claim 1, wherein
out of the two vertical signal lines, a first vertical signal line is connected to a first column area of the at least two column areas, and a second vertical signal line is connected to a second column area of the at least two column areas,
the first column area and the second column area are arranged via the current source, and
the free area is an isosceles triangle, and each of the two vertical signal lines of the plurality of vertical signal lines is arranged to be along a corresponding one of two equal sides of the isosceles triangle.

6. The solid-state imaging device according to claim 1, further comprising:
a plurality of current sources, wherein
each of the plurality of current sources is between corresponding two column areas of the at least two column areas,
the plurality of vertical signal lines is wired such that intervals between adjacent plurality of vertical signal lines are equal intervals toward at least one current source among the plurality of current sources, and the free area is an isosceles triangle, and each of the two vertical signal lines of the plurality of vertical signal lines is arranged to be along a corresponding one of two equal sides of the isosceles triangle.

7. An electronic device, comprising:
a solid-state imaging device, wherein
the solid-state imaging device includes:
  a pixel array that includes a pixel configured to generate a pixel signal;
  at least two column areas configured to selectively perform analog to digital conversion of the pixel signal;
  a plurality of vertical signal lines configured to selectively transfer the pixel signal to the at least two column areas;
  a free area in which the plurality of vertical signal lines is not wired; and
  a current source configured to supply a power source to the at least two column areas, wherein
    the current source is between two column areas of the at least two column areas,
    two vertical signal lines of the plurality of vertical signal lines face each other;
    the two vertical signal lines of the plurality of vertical signals sandwich the free area, and
    lengths of the two vertical signal lines are substantially equal to each other.

* * * * *